(12) United States Patent
Charbonneau et al.

(10) Patent No.: US 11,233,484 B2
(45) Date of Patent: Jan. 25, 2022

(54) PROCESS OF USING A SUBMERGED COMBUSTION MELTER TO PRODUCE HOLLOW GLASS FIBER OR SOLID GLASS FIBER HAVING ENTRAINED BUBBLES, AND BURNERS AND SYSTEMS TO MAKE SUCH FIBERS

(71) Applicant: JOHNS MANVILLE, Denver, CO (US)

(72) Inventors: Mark William Charbonneau, Highlands Ranch, CO (US); Kevin Patrick McHugh, Indianapolis, IN (US)

(73) Assignee: Johns Manville, Denver, CO (US)

( * ) Notice: Subject to any disclaimer, the term of this patent is extended or adjusted under 35 U.S.C. 154(b) by 0 days.

(21) Appl. No.: 16/405,844

(22) Filed: May 7, 2019

(65) Prior Publication Data
US 2019/0263712 A1     Aug. 29, 2019

Related U.S. Application Data

(60) Continuation of application No. 15/896,742, filed on Feb. 14, 2018, which is a continuation of application
(Continued)

(51) Int. Cl.
*C03B 37/075*     (2006.01)
*F23D 14/62*     (2006.01)
(Continued)

(52) U.S. Cl.
CPC ........... *H03F 1/3205* (2013.01); *C03B 5/193* (2013.01); *C03B 5/2353* (2013.01);
(Continued)

(58) Field of Classification Search
CPC ... C03B 37/0756; C03B 37/022; C03B 37/07; C03B 37/075; C03B 5/193;
(Continued)

(56) References Cited

U.S. PATENT DOCUMENTS 1,579,353 A    4/1926   Good
1,636,151 A    7/1927   Schofield
(Continued)

FOREIGN PATENT DOCUMENTS

DE     40 00 358 C2    3/1993
EP     0 181 248 B1   10/1989
(Continued)

OTHER PUBLICATIONS

"AccuTru Temperature Measurement," AccuTru International Corporation, 2003.
(Continued)

*Primary Examiner* — Queenie S Dehghan
(74) *Attorney, Agent, or Firm* — Robert D. Touslee

(57) ABSTRACT

Processes and systems for producing glass fibers having regions devoid of glass using submerged combustion melters, including feeding a vitrifiable feed material into a feed inlet of a melting zone of a melter vessel, and heating the vitrifiable material with at least one burner directing combustion products of an oxidant and a first fuel into the melting zone under a level of the molten material in the zone. One or more of the burners is configured to impart heat and turbulence to the molten material, producing a turbulent molten material comprising a plurality of bubbles suspended in the molten material, the bubbles comprising at least some of the combustion products, and optionally other gas species introduced by the burners. The molten material and bubbles are drawn through a bushing fluidly connected to a fore-
(Continued)

hearth to produce a glass fiber comprising a plurality of interior regions substantially devoid of glass.

14 Claims, 9 Drawing Sheets

Related U.S. Application Data

No. 15/272,703, filed on Sep. 22, 2016, now Pat. No. 9,926,219, which is a continuation of application No. 14/686,102, filed on Apr. 14, 2015, now Pat. No. 9,493,375, which is a division of application No. 13/540,771, filed on Jul. 3, 2012, now Pat. No. 9,032,760.

(51) Int. Cl.

| | |
|---|---|
| *C03B 37/022* | (2006.01) |
| *C03B 37/07* | (2006.01) |
| *C03B 5/235* | (2006.01) |
| *F23C 6/04* | (2006.01) |
| *F23D 14/22* | (2006.01) |
| *F23D 14/78* | (2006.01) |
| *C03B 7/02* | (2006.01) |
| *C03B 5/193* | (2006.01) |
| *H03F 1/32* | (2006.01) |
| *H03F 3/72* | (2006.01) |
| *H03G 1/00* | (2006.01) |
| *H03G 3/00* | (2006.01) |
| *H03F 1/56* | (2006.01) |
| *H03F 3/195* | (2006.01) |
| *H03G 3/10* | (2006.01) |

(52) U.S. Cl.
CPC ............. *C03B 5/2356* (2013.01); *C03B 7/02* (2013.01); *C03B 37/022* (2013.01); *C03B 37/07* (2013.01); *C03B 37/075* (2013.01); *C03B 37/0756* (2013.01); *F23C 6/047* (2013.01); *F23D 14/22* (2013.01); *F23D 14/62* (2013.01); *F23D 14/78* (2013.01); *H03F 1/56* (2013.01); *H03F 3/195* (2013.01); *H03F 3/72* (2013.01); *H03G 1/0029* (2013.01); *H03G 1/0088* (2013.01); *H03G 1/0094* (2013.01); *H03G 3/001* (2013.01); *H03G 3/008* (2013.01); *H03G 3/10* (2013.01); *C03B 2201/00* (2013.01); *C03B 2203/14* (2013.01); *C03B 2203/16* (2013.01); *C03B 2211/22* (2013.01); *C03B 2211/23* (2013.01); *C03B 2211/40* (2013.01); *C03B 2211/60* (2013.01); *F23C 2201/20* (2013.01); *F23C 2201/301* (2013.01); *H03F 2200/18* (2013.01); *H03F 2200/21* (2013.01); *H03F 2200/211* (2013.01); *H03F 2200/213* (2013.01); *H03F 2200/222* (2013.01); *H03F 2200/225* (2013.01); *H03F 2200/24* (2013.01); *H03F 2200/243* (2013.01); *H03F 2200/249* (2013.01); *H03F 2200/27* (2013.01); *H03F 2200/294* (2013.01); *H03F 2200/297* (2013.01); *H03F 2200/301* (2013.01); *H03F 2200/306* (2013.01); *H03F 2200/312* (2013.01); *H03F 2200/387* (2013.01); *H03F 2200/391* (2013.01); *H03F 2200/399* (2013.01); *H03F 2200/417* (2013.01); *H03F 2200/451* (2013.01); *H03F 2200/48* (2013.01); *H03F 2200/489* (2013.01); *H03F 2200/492* (2013.01); *H03F 2200/495* (2013.01); *H03F 2200/546* (2013.01); *H03F 2200/72* (2013.01); *H03F 2200/75* (2013.01); *H03G 2201/106* (2013.01); *H03G 2201/307* (2013.01); *H03G 2201/504* (2013.01); *Y02P 40/50* (2015.11)

(58) Field of Classification Search
CPC ....... C03B 5/2353; C03B 5/2356; C03B 7/02; C03B 2211/22; C03B 2211/23; C03B 2211/40; C03B 2211/60; F23C 6/047; F23C 2201/20; F23C 2201/301; F23D 14/22; F23D 14/62; F23D 14/78
See application file for complete search history.

(56) References Cited

U.S. PATENT DOCUMENTS

| | | |
|---|---|---|
| 1,679,295 A | 7/1928 | Dodge |
| 1,706,857 A | 3/1929 | Mathe |
| 1,716,433 A | 6/1929 | Ellis |
| 1,875,474 A | 9/1932 | McKinley |
| 1,883,023 A | 10/1932 | Slick |
| 1,937,321 A | 11/1933 | Howard |
| 1,944,855 A | 1/1934 | Wadman |
| 1,989,103 A | 1/1935 | McKelvey et al. |
| 2,042,560 A | 6/1936 | Stewart |
| 2,064,546 A | 12/1936 | Kutchka |
| 2,174,533 A | 10/1939 | See et al. |
| 2,118,479 A | 1/1940 | McCaskey |
| 2,269,459 A | 1/1942 | Kleist |
| 2,432,942 A | 12/1947 | See et al. |
| 2,455,907 A | 1/1948 | Slayter |
| 2,597,858 A | 5/1952 | Howard |
| 2,658,094 A | 11/1953 | Nonken |
| 2,677,003 A | 4/1954 | Arbeit et al. |
| 2,679,749 A | 6/1954 | Poole |
| 2,691,689 A | 10/1954 | Arbeit et al. |
| 2,718,096 A | 9/1955 | Henry et al. |
| 2,773,545 A | 12/1956 | Petersen |
| 2,781,756 A | 2/1957 | Kobe |
| 2,867,972 A | 1/1959 | Holderreed et al. |
| 2,878,644 A | 3/1959 | Fenn |
| 2,890,166 A | 6/1959 | Heinze |
| 2,902,029 A | 9/1959 | Hill |
| 2,981,250 A | 4/1961 | Stewart |
| 3,020,165 A | 2/1962 | Davis |
| 3,056,283 A | 10/1962 | Tiede |
| 3,073,683 A | 1/1963 | Switzer et al. |
| 3,084,392 A | 4/1963 | Labino |
| 3,088,812 A | 5/1963 | Bitterlich et al. |
| 3,104,947 A | 9/1963 | Switzer et al. |
| 3,129,087 A | 4/1964 | Hagy |
| 3,160,578 A | 12/1964 | Saxton et al. |
| 3,165,452 A | 1/1965 | Williams |
| 3,170,781 A | 2/1965 | Keefer |
| 3,174,820 A | 3/1965 | See et al. |
| 3,215,189 A | 11/1965 | Bauer |
| 3,224,855 A | 12/1965 | Plumat |
| 3,226,220 A | 12/1965 | Plumat |
| 3,237,929 A | 3/1966 | Plumat et al. |
| 3,239,325 A | 3/1966 | Roberson et al. |
| 3,241,548 A | 3/1966 | See et al. |
| 3,245,769 A | 4/1966 | Eck et al. |
| 3,248,205 A | 4/1966 | Dolf et al. |
| 3,248,206 A | 4/1966 | Apple et al. |
| 3,260,587 A | 7/1966 | Dolf et al. |
| 3,268,313 A | 8/1966 | Burgman et al. |
| 3,285,834 A | 11/1966 | Guerrieri et al. |
| 3,294,512 A | 12/1966 | Penberthy |
| 3,325,298 A | 6/1967 | Brown |
| 3,375,095 A | 3/1968 | Poole |
| 3,380,463 A | 4/1968 | Trethewey |
| 3,385,686 A | 5/1968 | Plumat et al. |
| 3,402,025 A | 9/1968 | Garrett et al. |
| 3,407,805 A | 10/1968 | Bougard |
| 3,407,862 A | 10/1968 | Mustian, Jr. |
| 3,420,510 A | 1/1969 | Griem |
| 3,421,873 A | 1/1969 | Burgman et al. |
| 3,421,876 A | 1/1969 | Schmidt |

(56) References Cited

U.S. PATENT DOCUMENTS

| | | |
|---|---|---|
| 3,432,399 A | 3/1969 | Schutt |
| 3,442,633 A | 5/1969 | Perry |
| 3,445,214 A | 5/1969 | Oremesher |
| 3,498,779 A | 3/1970 | Hathaway |
| 3,499,743 A | 3/1970 | Fanica et al. |
| 3,510,393 A | 5/1970 | Burgman et al. |
| 3,519,412 A | 7/1970 | Olink |
| 3,525,674 A | 8/1970 | Barnebey |
| 3,533,770 A | 10/1970 | Adler et al. |
| 3,547,611 A | 12/1970 | Williams |
| 3,563,683 A | 2/1971 | Hess |
| 3,573,016 A | 3/1971 | Rees |
| 3,592,151 A | 7/1971 | Webber |
| 3,592,623 A | 7/1971 | Shepherd |
| 3,600,149 A | 8/1971 | Chen et al. |
| 3,606,825 A | 9/1971 | Johnson |
| 3,617,234 A | 11/1971 | Hawkins et al. |
| 3,627,504 A | 12/1971 | Johnson et al. |
| 3,632,335 A | 1/1972 | Womer |
| 3,649,235 A | 3/1972 | Harris |
| 3,692,017 A | 9/1972 | Glachant et al. |
| 3,717,139 A | 2/1973 | Guillet et al. |
| 3,738,792 A | 6/1973 | Feng |
| 3,741,656 A | 6/1973 | Shapiro |
| 3,741,742 A | 6/1973 | Jennings |
| 3,746,527 A | 7/1973 | Knavish et al. |
| 3,747,588 A | 7/1973 | Malmin |
| 3,754,879 A | 8/1973 | Phaneuf |
| 3,756,800 A | 9/1973 | Phaneuf |
| 3,763,915 A | 10/1973 | Perry et al. |
| 3,764,287 A | 10/1973 | Brocious |
| 3,771,988 A | 11/1973 | Starr |
| 3,788,832 A | 1/1974 | Nesbitt |
| 3,818,893 A | 6/1974 | Kataoka et al. |
| 3,835,909 A | 9/1974 | Douglas et al. |
| 3,840,002 A | 10/1974 | Douglas et al. |
| 3,856,496 A | 12/1974 | Nesbitt et al. |
| 3,885,945 A | 5/1975 | Rees et al. |
| 3,907,585 A | 9/1975 | Francel et al. |
| 3,913,560 A | 10/1975 | Lazarre et al. |
| 3,929,445 A | 12/1975 | Zippe |
| 3,936,290 A | 2/1976 | Cerutti et al. |
| 3,951,635 A | 4/1976 | Rough |
| 3,976,464 A | 8/1976 | Wardlaw |
| 4,001,001 A | 1/1977 | Knavish et al. |
| 4,004,903 A | 1/1977 | Daman et al. |
| 4,028,083 A | 6/1977 | Patznick et al. |
| 4,083,711 A | 4/1978 | Jensen |
| 4,101,304 A | 7/1978 | Marchand |
| 4,110,098 A | 8/1978 | Mattmuller |
| 4,153,438 A | 5/1979 | Stream |
| 4,185,982 A | 1/1980 | Schwenninger |
| 4,203,761 A | 5/1980 | Rose |
| 4,205,966 A | 6/1980 | Horikawa |
| 4,208,201 A | 6/1980 | Rueck |
| 4,226,564 A | 10/1980 | Takahashi et al. |
| 4,238,226 A | 12/1980 | Sanzenbacher et al. |
| 4,249,927 A | 2/1981 | Fakuzaki et al. |
| 4,270,740 A | 6/1981 | Sanzenbacher et al. |
| 4,282,023 A | 8/1981 | Hammel et al. |
| 4,303,435 A | 12/1981 | Sleighter |
| 4,309,204 A | 1/1982 | Brooks |
| 4,316,734 A | 2/1982 | Spinosa et al. |
| 4,323,718 A | 4/1982 | Buhring et al. |
| 4,349,376 A | 9/1982 | Dunn et al. |
| 4,360,373 A | 11/1982 | Pecoraro |
| 4,397,692 A | 8/1983 | Ramge et al. |
| 4,398,925 A | 8/1983 | Trinh et al. |
| 4,405,351 A | 9/1983 | Sheinkop |
| 4,406,683 A | 9/1983 | Demarest |
| 4,413,882 A | 11/1983 | Bailey et al. |
| 4,424,071 A | 1/1984 | Steitz et al. |
| 4,432,780 A | 2/1984 | Propster et al. |
| 4,455,762 A | 6/1984 | Saeman |
| 4,461,576 A | 7/1984 | King |
| 4,488,537 A | 12/1984 | Laurent |
| 4,508,970 A | 4/1985 | Ackerman |
| 4,539,034 A | 9/1985 | Hanneken |
| 4,542,106 A | 9/1985 | Sproull |
| 4,545,800 A | 10/1985 | Won et al. |
| 4,549,896 A | 10/1985 | Streicher et al. |
| 4,599,100 A | 7/1986 | Demarest |
| 4,622,007 A | 11/1986 | Gitman |
| 4,626,199 A | 12/1986 | Bounini |
| 4,632,687 A | 12/1986 | Kunkle et al. |
| 4,634,461 A | 1/1987 | Demarest, Jr. et al. |
| 4,657,586 A | 4/1987 | Masterson et al. |
| 4,718,931 A | 1/1988 | Boettner |
| 4,723,708 A | 2/1988 | Berger et al. |
| 4,735,642 A | 4/1988 | Jensen et al. |
| 4,738,938 A | 4/1988 | Kunkle et al. |
| 4,758,259 A | 7/1988 | Jensen |
| 4,780,122 A | 10/1988 | Schwenninger et al. |
| 4,794,860 A | 1/1989 | Welton |
| 4,798,616 A | 1/1989 | Knavish et al. |
| 4,812,372 A | 3/1989 | Kithany |
| 4,814,387 A | 3/1989 | Donat |
| 4,816,056 A | 3/1989 | Tsai et al. |
| 4,818,265 A | 4/1989 | Krumwiede et al. |
| 4,877,436 A | 10/1989 | Sheinkop |
| 4,877,449 A | 10/1989 | Khinkis |
| 4,878,829 A | 11/1989 | Anderson |
| 4,882,736 A | 11/1989 | Pieper |
| 4,886,539 A | 12/1989 | Gerutti et al. |
| 4,900,337 A | 2/1990 | Zortea et al. |
| 4,919,700 A | 4/1990 | Pecoraro et al. |
| 4,927,886 A | 5/1990 | Backderf et al. |
| 4,932,035 A | 6/1990 | Pieper |
| 4,953,376 A | 9/1990 | Merlone |
| 4,963,731 A | 10/1990 | King |
| 4,969,942 A | 11/1990 | Schwenninger et al. |
| 4,973,346 A | 11/1990 | Kobayashi et al. |
| 5,011,086 A | 4/1991 | Sonnleitner |
| 5,032,230 A | 7/1991 | Shepherd |
| 5,052,874 A | 10/1991 | Johanson |
| 5,062,789 A | 11/1991 | Gitman |
| 5,097,802 A | 3/1992 | Clawson |
| 5,168,109 A | 12/1992 | Backderf et al. |
| 5,169,424 A | 12/1992 | Grinnen et al. |
| 5,194,747 A | 3/1993 | Culpepper et al. |
| 5,199,866 A | 4/1993 | Joshi et al. |
| 5,204,082 A | 4/1993 | Schendel |
| 5,299,929 A | 4/1994 | Yap |
| 5,360,171 A | 11/1994 | Yap |
| 5,374,595 A | 12/1994 | Dumbaugh et al. |
| 5,405,082 A | 4/1995 | Brown et al. |
| 5,412,882 A | 5/1995 | Zippe et al. |
| 5,449,286 A | 9/1995 | Snyder et al. |
| 5,473,885 A | 12/1995 | Hunter, Jr. et al. |
| 5,483,548 A | 1/1996 | Coble |
| 5,490,775 A | 2/1996 | Joshi et al. |
| 5,522,721 A | 6/1996 | Drogue et al. |
| 5,545,031 A | 8/1996 | Joshi et al. |
| 5,575,637 A | 11/1996 | Slavejkov et al. |
| 5,586,999 A | 12/1996 | Kobayashi |
| 5,595,703 A | 1/1997 | Swaelens et al. |
| 5,606,965 A | 3/1997 | Panz et al. |
| 5,613,994 A | 3/1997 | Muniz et al. |
| 5,615,668 A | 4/1997 | Panz et al. |
| 5,636,623 A | 6/1997 | Panz et al. |
| 5,672,827 A | 9/1997 | Jursich |
| 5,713,668 A | 2/1998 | Lunghofer et al. |
| 5,714,113 A * | 2/1998 | Gitman .............. C21B 5/003 266/182 |
| 5,718,741 A | 2/1998 | Hull et al. |
| 5,724,901 A | 3/1998 | Guy et al. |
| 5,736,476 A | 4/1998 | Warzke et al. |
| 5,743,723 A | 4/1998 | Tatrides et al. |
| 5,765,964 A | 6/1998 | Calcote et al. |
| 5,814,121 A | 9/1998 | Travis |
| 5,829,962 A | 11/1998 | Drasek et al. |
| 5,833,447 A | 11/1998 | Bodelin et al. |
| 5,849,058 A | 12/1998 | Takeshita et al. |
| 5,863,195 A | 1/1999 | Feldermann |

(56) References Cited

U.S. PATENT DOCUMENTS

| | | |
|---|---|---|
| 5,887,978 A | 3/1999 | Lunghofer et al. |
| 5,944,507 A | 8/1999 | Feldermann |
| 5,944,864 A | 8/1999 | Hull et al. |
| 5,954,498 A | 9/1999 | Joshi et al. |
| 5,975,886 A | 11/1999 | Phillippe |
| 5,979,191 A | 11/1999 | Jian |
| 5,984,667 A | 11/1999 | Phillippe et al. |
| 5,993,203 A | 11/1999 | Koppang |
| 6,029,910 A | 2/2000 | Joshi et al. |
| 6,036,480 A | 3/2000 | Hughes et al. |
| 6,039,787 A | 3/2000 | Edlinger |
| 6,044,667 A | 4/2000 | Chenoweth |
| 6,045,353 A | 4/2000 | VonDrasek et al. |
| 6,068,468 A | 5/2000 | Phillipe et al. |
| 6,071,116 A | 6/2000 | Phillipe et al. |
| 6,074,197 A | 6/2000 | Phillippe |
| 6,077,072 A | 6/2000 | Marin et al. |
| 6,085,551 A | 7/2000 | Pieper et al. |
| 6,109,062 A | 8/2000 | Richards |
| 6,113,389 A | 9/2000 | Joshi et al. |
| 6,116,896 A | 9/2000 | Joshi et al. |
| 6,120,889 A | 9/2000 | Turner et al. |
| 6,123,542 A | 9/2000 | Joshi et al. |
| 6,126,438 A | 10/2000 | Joshi et al. |
| 6,154,481 A | 11/2000 | Sorg et al. |
| 6,156,285 A | 12/2000 | Adams et al. |
| 6,171,100 B1 | 1/2001 | Joshi et al. |
| 6,178,777 B1 | 1/2001 | Chenoweth |
| 6,183,848 B1 | 2/2001 | Turner et al. |
| 6,210,151 B1 | 4/2001 | Joshi et al. |
| 6,210,703 B1 | 4/2001 | Novich |
| 6,237,369 B1 | 5/2001 | LeBlanc et al. |
| 6,241,514 B1 | 6/2001 | Joshi et al. |
| 6,244,197 B1 | 6/2001 | Coble |
| 6,244,857 B1 | 6/2001 | VonDrasek et al. |
| 6,247,315 B1 | 6/2001 | Marin et al. |
| 6,250,136 B1 | 6/2001 | Igreja |
| 6,250,916 B1 | 6/2001 | Phillipe et al. |
| 6,274,164 B1 | 8/2001 | Novich |
| 6,276,924 B1 | 8/2001 | Joshi et al. |
| 6,276,928 B1 | 8/2001 | Joshi et al. |
| 6,293,277 B1 | 9/2001 | Panz et al. |
| 6,314,760 B1 | 11/2001 | Chenoweth |
| 6,314,896 B1 | 11/2001 | Marin et al. |
| 6,318,126 B1 | 11/2001 | Takei et al. |
| 6,332,339 B1 | 12/2001 | Kawaguchi et al. |
| 6,338,337 B1 | 1/2002 | Panz et al. |
| 6,339,610 B1 | 1/2002 | Hoyer et al. |
| 6,344,747 B1 | 2/2002 | Lunghofer et al. |
| 6,357,264 B1 | 3/2002 | Richards |
| 6,386,271 B1 | 5/2002 | Kawamoto et al. |
| 6,398,547 B1 | 6/2002 | Joshi et al. |
| 6,404,799 B1 | 6/2002 | Mori et al. |
| 6,418,755 B2 | 7/2002 | Chenoweth |
| 6,422,041 B1 | 7/2002 | Simpson et al. |
| 6,454,562 B1 | 9/2002 | Joshi et al. |
| 6,460,376 B1 | 10/2002 | Jeanvoine et al. |
| 6,470,710 B1 | 10/2002 | Takei et al. |
| 6,536,238 B2 | 3/2003 | Kawaguchi et al. |
| 6,536,651 B2 | 3/2003 | Ezumi et al. |
| 6,558,606 B1 | 5/2003 | Kulkarni et al. |
| 6,578,779 B2 | 6/2003 | Dion |
| 6,660,106 B1 | 12/2003 | Babel et al. |
| 6,694,791 B1 | 2/2004 | Johnson et al. |
| 6,701,617 B2 | 3/2004 | Li et al. |
| 6,701,751 B2 | 3/2004 | Arechaga et al. |
| 6,705,118 B2 | 3/2004 | Simpson et al. |
| 6,708,527 B1 | 3/2004 | Ibarlucea et al. |
| 6,711,942 B2 | 3/2004 | Getman et al. |
| 6,715,319 B2 | 4/2004 | Barrow et al. |
| 6,722,161 B2 | 4/2004 | LeBlanc |
| 6,736,129 B1 | 5/2004 | Sjith |
| 6,739,152 B2 | 5/2004 | Jeanvoine et al. |
| 6,796,147 B2 | 9/2004 | Borysowicz et al. |
| 6,797,351 B2 | 9/2004 | Kulkarni et al. |
| 6,854,290 B2 | 2/2005 | Hayes et al. |
| 6,857,999 B2 | 2/2005 | Jeanvoine |
| 6,883,349 B1 | 4/2005 | Jeanvoine |
| 6,918,256 B2 | 7/2005 | Gutmark et al. |
| 7,027,467 B2 | 4/2006 | Baev et al. |
| 7,116,888 B1 | 10/2006 | Aitken et al. |
| 7,134,300 B2 | 11/2006 | Hayes et al. |
| 7,168,395 B2 | 1/2007 | Engdahl |
| 7,175,423 B1 | 2/2007 | Pisano et al. |
| 7,231,788 B2 | 6/2007 | Karetta et al. |
| 7,273,583 B2 | 9/2007 | Rue et al. |
| 7,330,634 B2 | 2/2008 | Aitken et al. |
| 7,383,698 B2 | 6/2008 | Ichinose et al. |
| 7,392,668 B2 | 7/2008 | Adams et al. |
| 7,428,827 B2 | 9/2008 | Maugendre et al. |
| 7,441,686 B2 | 10/2008 | Odajima et al. |
| 7,448,231 B2 | 11/2008 | Jeanvoine et al. |
| 7,454,925 B2 | 11/2008 | DeAngelis et al. |
| 7,509,819 B2 | 3/2009 | Baker et al. |
| 7,565,819 B2 | 7/2009 | Jeanvoine et al. |
| 7,578,988 B2 | 8/2009 | Jacques et al. |
| 7,581,948 B2 | 9/2009 | Borders et al. |
| 7,622,677 B2 | 11/2009 | Barberree et al. |
| 7,624,595 B2 | 12/2009 | Jeanvoine et al. |
| 7,748,592 B2 | 7/2010 | Koga et al. |
| 7,767,606 B2 | 8/2010 | McGinnis et al. |
| 7,778,290 B2 | 8/2010 | Sacks et al. |
| 7,781,562 B2 | 8/2010 | Crawford et al. |
| 7,802,452 B2 | 9/2010 | Borders et al. |
| 7,832,365 B2 | 11/2010 | Hannum et al. |
| 7,845,314 B2 | 12/2010 | Smith |
| 7,855,267 B2 | 12/2010 | Crawford et al. |
| 7,946,136 B2 | 5/2011 | Watkinson |
| 8,033,254 B2 | 10/2011 | Hannum et al. |
| 8,279,899 B2 | 10/2012 | Kitabayashi |
| 8,285,411 B2 | 10/2012 | Hull et al. |
| 8,402,787 B2 | 3/2013 | Pemode et al. |
| 8,424,342 B2 | 4/2013 | Kiefer et al. |
| 8,487,262 B2 | 7/2013 | Damm et al. |
| 8,650,914 B2 | 2/2014 | Charbonneau |
| 8,707,739 B2 | 4/2014 | Huber et al. |
| 8,707,740 B2 | 4/2014 | Huber et al. |
| 8,769,992 B2 | 7/2014 | Huber |
| 8,875,544 B2 | 11/2014 | Charbonneau |
| 8,973,400 B2 | 3/2015 | Charbonneau et al. |
| 8,973,405 B2 | 3/2015 | Charbonneau et al. |
| 8,991,215 B2 | 3/2015 | Shock et al. |
| 8,997,525 B2 | 4/2015 | Shock et al. |
| 9,021,838 B2 | 5/2015 | Charbonneau et al. |
| 9,032,760 B2 | 5/2015 | Charbonneau et al. |
| 9,096,452 B2 | 8/2015 | Charbonneau et al. |
| 9,096,453 B2 | 8/2015 | Charbonneau |
| 2001/0039813 A1 | 11/2001 | Simpson et al. |
| 2002/0086077 A1 | 7/2002 | Noller et al. |
| 2002/0124598 A1 | 9/2002 | Borysowicz et al. |
| 2002/0134112 A1 | 9/2002 | Barrow et al. |
| 2002/0152770 A1 | 10/2002 | Becher et al. |
| 2002/0162358 A1 | 11/2002 | Jeanvoine et al. |
| 2002/0166343 A1 | 11/2002 | LeBlanc |
| 2003/0000250 A1 | 1/2003 | Arechaga et al. |
| 2003/0015000 A1 | 1/2003 | Hayes et al. |
| 2003/0029197 A1 | 2/2003 | Jeanvoine et al. |
| 2003/0037571 A1 | 2/2003 | Kobayashi et al. |
| 2004/0025569 A1 | 2/2004 | Damm et al. |
| 2004/0099009 A1 | 5/2004 | Linz et al. |
| 2004/0128098 A1 | 7/2004 | Neuhaus et al. |
| 2004/0131988 A1 | 7/2004 | Baker et al. |
| 2004/0168474 A1 | 9/2004 | Jeanvoine et al. |
| 2004/0224833 A1 | 11/2004 | Jeanvoine et al. |
| 2005/0039491 A1 | 2/2005 | Maugendre et al. |
| 2005/0061030 A1 | 3/2005 | Ichinose et al. |
| 2005/0083989 A1 | 4/2005 | Leister et al. |
| 2005/0103323 A1 | 5/2005 | Engdal |
| 2005/0236747 A1 | 10/2005 | Rue et al. |
| 2006/0000239 A1 | 1/2006 | Jeanvoine et al. |
| 2006/0101859 A1 | 5/2006 | Tagaki et al. |
| 2006/0122450 A1 | 6/2006 | Kim et al. |
| 2006/0144089 A1 | 7/2006 | Eichholz et al. |
| 2006/0162387 A1 | 7/2006 | Schmitt et al. |

(56) References Cited

U.S. PATENT DOCUMENTS

| | | |
|---|---|---|
| 2006/0174655 A1 | 8/2006 | Kobayashi et al. |
| 2006/0177785 A1 | 8/2006 | Varagani et al. |
| 2006/0233512 A1 | 10/2006 | Aitken et al. |
| 2006/0257097 A1 | 11/2006 | Aitken et al. |
| 2006/0287482 A1 | 12/2006 | Crawford et al. |
| 2006/0293494 A1 | 12/2006 | Crawford et al. |
| 2006/0293495 A1 | 12/2006 | Crawford et al. |
| 2007/0051136 A1 | 3/2007 | Watkinson |
| 2007/0106054 A1 | 5/2007 | Crawford et al. |
| 2007/0122332 A1 | 5/2007 | Jacques et al. |
| 2007/0130994 A1 | 6/2007 | Boratav et al. |
| 2007/0137259 A1 | 6/2007 | Borders et al. |
| 2007/0212546 A1 | 9/2007 | Jeanvoine et al. |
| 2007/0220922 A1 | 9/2007 | Bauer et al. |
| 2007/0266737 A1 | 11/2007 | Rodek et al. |
| 2007/0278404 A1 | 12/2007 | Spanke et al. |
| 2008/0035078 A1 | 2/2008 | Li |
| 2008/0227615 A1 | 9/2008 | McGinnis et al. |
| 2008/0256981 A1 | 10/2008 | Jacques et al. |
| 2008/0276652 A1 | 11/2008 | Bauer et al. |
| 2008/0278404 A1 | 11/2008 | Blalock et al. |
| 2008/0293857 A1 | 11/2008 | Crawford et al. |
| 2008/0302136 A1 | 12/2008 | Bauer et al. |
| 2009/0042709 A1 | 2/2009 | Jeanvoine et al. |
| 2009/0044568 A1 | 2/2009 | Lewis |
| 2009/0120133 A1 | 5/2009 | Fraley et al. |
| 2009/0176639 A1 | 7/2009 | Jacques et al. |
| 2009/0220899 A1 | 9/2009 | Spangelo et al. |
| 2009/0235695 A1 | 9/2009 | Pierrot et al. |
| 2009/0320525 A1 | 12/2009 | Johnson |
| 2010/0064732 A1 | 3/2010 | Jeanvoine et al. |
| 2010/0087574 A1 | 4/2010 | Crawford et al. |
| 2010/0089383 A1 | 4/2010 | Cowles |
| 2010/0120979 A1 | 5/2010 | Crawford et al. |
| 2010/0139325 A1 | 6/2010 | Watkinson |
| 2010/0143601 A1 | 6/2010 | Hawtof et al. |
| 2010/0162757 A1 | 7/2010 | Brodie |
| 2010/0227971 A1 | 9/2010 | Crawford et al. |
| 2010/0236323 A1 | 9/2010 | D'Angelico et al. |
| 2010/0242543 A1 | 9/2010 | Ritter et al. |
| 2010/0300153 A1 | 12/2010 | Zhang et al. |
| 2010/0304314 A1 | 12/2010 | Rouchy et al. |
| 2010/0307196 A1 | 12/2010 | Richardson |
| 2010/0313604 A1 | 12/2010 | Watson et al. |
| 2010/0319404 A1 | 12/2010 | Borders et al. |
| 2010/0326137 A1 | 12/2010 | Rouchy et al. |
| 2011/0016922 A1 | 1/2011 | Kitamura et al. |
| 2011/0048125 A1 | 3/2011 | Jackson et al. |
| 2011/0054091 A1 | 3/2011 | Crawford et al. |
| 2011/0061642 A1 | 3/2011 | Rouchy et al. |
| 2011/0088432 A1 | 4/2011 | Pumode et al. |
| 2011/0107670 A1 | 5/2011 | Galley et al. |
| 2011/0236846 A1 | 9/2011 | Rue et al. |
| 2011/0308280 A1 | 12/2011 | Huber |
| 2012/0033792 A1 | 2/2012 | Kulik et al. |
| 2012/0077135 A1 | 3/2012 | Charbonneau |
| 2012/0104306 A1 | 5/2012 | Kamiya et al. |
| 2012/0216567 A1 | 8/2012 | Boughton et al. |
| 2012/0216568 A1 | 8/2012 | Fisher et al. |
| 2012/0216576 A1 | 8/2012 | Boughton et al. |
| 2013/0072371 A1 | 3/2013 | Jansen et al. |
| 2013/0086944 A1 | 4/2013 | Shock et al. |
| 2013/0086949 A1* | 4/2013 | Charbonneau .......... F23D 14/64 65/134.4 |
| 2013/0086950 A1 | 4/2013 | Huber et al. |
| 2013/0086951 A1 | 4/2013 | Charbonneau et al. |
| 2013/0086952 A1 | 4/2013 | Charbonneau et al. |
| 2013/0123990 A1 | 5/2013 | Kulik et al. |
| 2013/0279532 A1 | 10/2013 | Ohmstede et al. |
| 2013/0283861 A1 | 10/2013 | Mobley et al. |
| 2013/0327092 A1 | 12/2013 | Charbonneau |
| 2014/0090421 A1 | 4/2014 | Shock et al. |
| 2014/0090422 A1 | 4/2014 | Charbonneau et al. |
| 2014/0090423 A1 | 4/2014 | Charbonneau et al. |
| 2014/0144185 A1 | 5/2014 | Shock et al. |
| 2016/0116214 A1 | 4/2016 | Kirschen |

FOREIGN PATENT DOCUMENTS

| | | |
|---|---|---|
| EP | 1 337 789 B1 | 12/2004 |
| EP | 1 990 321 A1 | 11/2008 |
| EP | 2 138 465 A2 | 12/2009 |
| EP | 1 986 966 B1 | 4/2010 |
| EP | 1 667 934 B1 | 2/2011 |
| EP | 2 397 446 A2 | 12/2011 |
| EP | 2 404 880 A1 | 1/2012 |
| EP | 2 433 911 A1 | 3/2012 |
| EP | 2 578 548 A2 | 4/2013 |
| GB | 191301772 | 1/1914 |
| GB | 191407633 | 3/1914 |
| GB | 164073 A | 5/1921 |
| GB | 250 536 A | 7/1926 |
| GB | 959 895 A | 6/1964 |
| GB | 1449439 | 9/1976 |
| GB | 1 514 317 A | 6/1978 |
| GB | 2 424 644 A | 10/2006 |
| JP | H08 290918 A | 11/1996 |
| KR | 100465272 B1 | 12/2004 |
| WO | 1998055411 A1 | 12/1998 |
| WO | 2008103291 A1 | 8/2008 |
| WO | 2009091558 A1 | 7/2009 |
| WO | 2010011701 A2 | 1/2010 |
| WO | 2010045196 A3 | 4/2010 |
| WO | 2012048790 A1 | 4/2012 |
| WO | 2012125665 A1 | 9/2012 |
| WO | 2013 162986 A1 | 10/2013 |
| WO | 2013 188082 A1 | 12/2013 |
| WO | 2013188167 A1 | 12/2013 |

OTHER PUBLICATIONS

"Glass Technologies—The Legacy of a Successful Public-Private Partnership", 2007, U.S. Department of Energy, pp. 1-32.

"Glass Melting Technology—A Technical and Economic Assessment," 2004, U.S. Department of Energy, pp. 1-292.

Muijsenberg, H. P. H., Neff, G., Muller, J., Chmelar, J., Bodi, R. and Matustikj, F. (2008) "An Advanced Control System to Increase Glass Quality and Glass Production Yields Based on GS ESLLI Technology", in A Collection of Papers Presented at the 66th Conference on Glass Problems: Ceramic Engineering and Science Proceedings, vol. 27, Issue 1 (ed W. M. Kriven), John Wiley & Sons, Inc., Hoboken, NJ, USA. doi: 10.1002/9780470291306.ch3.

Rue, "Energy-Efficient Glass Melting—The Next Generation Melter", Gas Technology Institute, Project No. 20621 Final Report (2008).

Muijsenberg, E., Eisenga, M. and Buchmayer, J. (2010) "Increase of Glass Production Efficiency and Energy Efficiency with Model-Based Predictive Control", in 70th Conference on Glass Problems: Ceramic Engineering and Science Proceedings, vol. 31, Issue 1 (ed C. H. Drummond), John Wiley & Sons, Inc., Hoboken, NJ, USA. doi: 10.1002/9780470769843.ch 15.

Sims, Richard, "Batch charging technologies—a review", www.glassonweb.com, Nikolaus Sorg Gmbh & Co KG (May 2011).

"Canty Process Technology" brochure, date unknown, copy received in Apr. 2012 at American Institute of Chemical Engineers, Spring Meeting, Houston, TX.

"Glass Melting", Battelle PNNL MST Handbook, U.S. Department of Energy, Pacific Northwest Laboratory, retrieved from the Internet Apr. 20, 2012.

"Roll Compaction", brochure from The Fitzpatrick Company, Elmhurst, Illinois, retrieved from the Internet Apr. 20, 2012.

"Glass Industry of the Future", United States Department of Energy, report 02-GA50113-03, pp. 1-17, Sep. 30, 2008.

Stevenson, "Foam Engineering: Fundamentals and Applications", Chapter 16, pp. 336-389, John Wiley & Sons (Mar. 13, 2012).

Clare et al., "Density and Surface Tension of Borate Containing Silicate Melts", Glass Technology—European Journal of Glass Science and Technology, Part A, pp. 59-62, vol. 44, No. 2, Apr. 1, 2003.

(56) References Cited

OTHER PUBLICATIONS

Seward, T.P., "Modeling of Glass Making Processes for Improved Efficiency", DE-FG07-96EE41262, Final Report, Mar. 31, 2003.
Conradt et al., Foaming behavior on glass melts, Glastechniche Berichte 60 (1987) Nr. 6, S. 189-201 Abstract Fraunhofer ISC.
Kim et al., "Foaming in Glass Melts Produced by Sodium Sulfate Decomposition under Isothermal Conditions", Journal of the American Ceramic Society, 74(3), pp. 551-555, 1991.
Kim et al., "Foaming in Glass Melts Produced by Sodium Sulfate Decomposition under Ramp Heating Conditions", Journal of the American Ceramic Society, 75(11), pp. 2959-2963, 1992.
Kim et al., "Effect of Furnace Atmosphere on E-glass Foaming", Journal of Non-Crystalline Solids, 352(50/51), pp. 5287-5295, 2006.
Van Limpt et al., "Modelling the evaporation of boron species. Part 1. Alkali-free borosilicate glass melts", Glass Technology—European Journal of Glass Science and Technology, Part A, 52(3): pp. 77-87, 2011.
Olabin, V.M. et al, "Submerged Combustion Furnace for Glass Melts," Ceramic Engineering and Science Proceedings, Jan. 1, 1996, pp. 84-92, vol. 17—No. 2, American Ceramic Society Inc., US.
"Gamma Irradiators for Radiation Processing" Booklet, International Atomic Energy Agency, Vienna, Austria.
Furman, BJ, ME 120 Experimental Methods Vibration Measurement, San Jose University Department of Mechanical and Aerospace Engineering.
Higley, BA, Glass Melter System Technologies for Vitrification of High-Sodium Content Low-Level, Radioactive, Liquid Wastes—Phase I: SBS Demonstration With Simulated Low-Level Waste—Final Test Report, Westinghouse Hanford Company.
Report for Treating Hanford LAW and WTP SW Simulants: Pilot Plant Mineralizing Flowsheet Apr. 2009, Department of Energy Environmental Management Consolidated Business Center by THOR Treatment Technologies, LLC.
Gerber, J., "Les Densimetres Industriels," Petrole et Techniques, Association Francaise des Techniciens du Petrole, Jun. 1, 1989, pp. 26-27, No. 349, Paris, France.
Rue et al., "Submerged Combustion Melting of Glass," International Journal of Applied Glass Science, Nov. 9, 2011, pp. 262-274, vol. 2, No. 4.
National Laboratory, US DOE Contract No. DE-AC09-08SR22470, Oct. 2011.

* cited by examiner

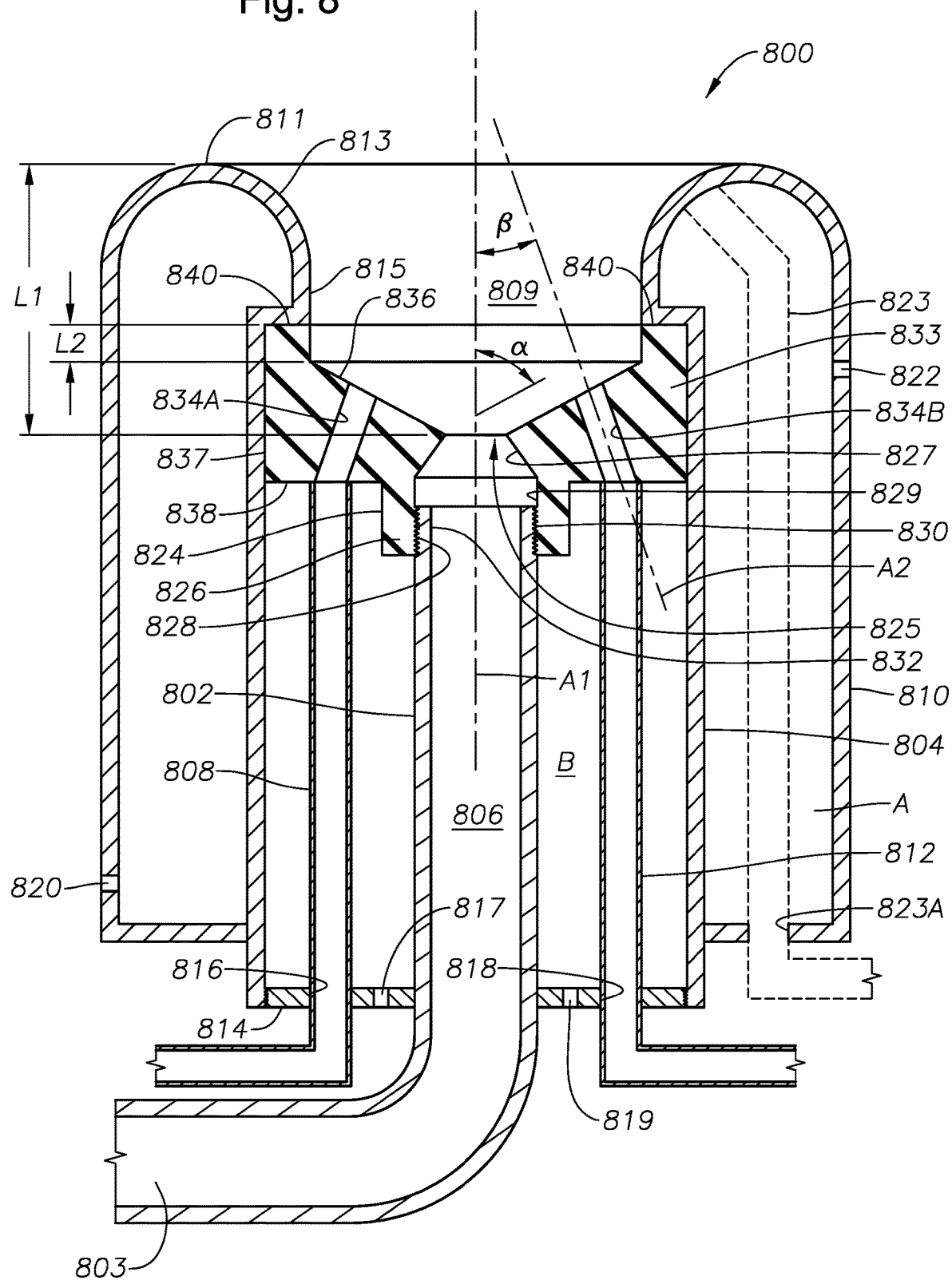

— 1 —

PROCESS OF USING A SUBMERGED COMBUSTION MELTER TO PRODUCE HOLLOW GLASS FIBER OR SOLID GLASS FIBER HAVING ENTRAINED BUBBLES, AND BURNERS AND SYSTEMS TO MAKE SUCH FIBERS

CROSS-REFERENCE TO RELATED APPLICATION

This application is a continuation of pending U.S. patent application Ser. No. 15/896,742, filed Feb. 14, 2018, which application is a continuation of U.S. patent application Ser. No. 15/272,703, filed Sep. 22, 2016, now U.S. Pat. No. 9,926,219 issued Mar. 27, 2018, which is a continuation of U.S. patent application Ser. No. 14/686,102 filed Apr. 14, 2015, now U.S. Pat. No. 9,493,375 issued Nov. 15, 2016, which is a division of U.S. patent application Ser. No. 13/540,771, filed Jul. 3, 2012, now U.S. Pat. No. 9,032,760 issued May 15, 2015.

BACKGROUND INFORMATION

Technical Field

The present disclosure relates generally to the field of combustion furnaces and methods of use, and more specifically to processes for producing hollow glass fiber or glass fibers comprising bubbles using a turbulent submerged combustion melter, and burners for carrying out such processes.

Background Art

In submerged combustion melting of glass and similar materials, combustion gases emitted from sidewall-mounted and/or floor-mounted burners are injected beneath the surface of a molten or partially molten mass of material being melted in a melter vessel and rise upward through the molten or partially molten mass. The molten or partially molten mass of material is a complex mixture of molten feed material (feed material is commonly referred to as "batch" in the glass industry), unmelted batch, and gases from the burners and evolved gases from the reaction of and/or decomposition of batch materials. Recycled glass or "cullet", as well as various waste materials of varying glass content (such as fiberglass batting or even loose fibers) may also be present. The materials are heated at a high efficiency via the intimate contact with the combustion gases. Using submerged combustion burners produces turbulence of the molten material or partially molten material. Vibration of the burners and/or the melter vessel walls themselves, due to sloshing of molten material, pulsing of combustion burners, popping of large bubbles above or aside of submerged burners, ejection of molten material from the melt against the walls and ceiling of melter vessel, and the like, are possible.

Traditional methods of making hollow fibers employ a bushing and a source of air feeding the air into the molten glass as it passes through a bushing. U.S. Pat. No. 2,269,459 discloses using a tube for injecting air into molten glass discharging vertically downward from a vessel, the tube extending through a bushing on the bottom of the melter. The initial hollow fiber formed is then drawn through and heated in a burner that provides intense flame and heat to form a much smaller diameter hollow fiber. Bushings are described in a series of patents for making fibers having intermittent hollowness along their length, as well as hollow glass fibers of more uniform hollowness, more ratio of ID/OD, and better concentricity of the central lumen. See U.S. Pat. Nos. 3,421,873; 3,510,393; 3,268,313; 4,735,642; and 4,758,259. None of these patents use or discuss submerged combustion. None of the previous solutions have recognized that submerged combustion produces a turbulent molten glass that has approximately 40 percent by volume gas bubbles. In fact, traditional glass melting technologies seek to reduce bubble content when making glass fibers, as it leads to frequent processing problems due to fiber breakage during drawing. Molten glass fining is called for to reduce or eliminate bubbles, the fining employing conditioning channels that may be difficult and/or expensive to operate.

It would be a significant advance in the glass melting art to develop processes of making hollow glass fibers, or solid glass fibers having entrained bubbles therein, and apparatus and systems to make such fibers.

SUMMARY

In accordance with the present disclosure, processes, systems, and apparatus for carrying out the processes are described that produce hollow glass fibers, or solid glass fibers having entrained bubbles therein, using submerged combustion melters. The processes, systems, and apparatus described herein are relevant to the full range of glass precursor materials that may be melted with submerged combustion technology, but are particularly well-suited for "glass batch", as that term is defined herein.

A first aspect of this disclosure is a process comprising:
a) feeding at least one partially or wholly vitrifiable feed material into a feed inlet of a turbulent melting zone of a melter vessel comprising a floor, a ceiling, and a wall connecting the floor and ceiling at a perimeter of the floor and ceiling, the melter vessel comprising a feed opening in the wall or ceiling and an exit end comprising a melter exit structure for discharging molten material formed in the turbulent melting zone;
b) heating the at least one partially or wholly vitrifiable material with at least one burner directing combustion products of an oxidant and a first fuel into the turbulent melting zone under a level of the molten material in the zone, one or more of the burners configured to impart heat and turbulence to at least some of the molten material in the turbulent melting zone, producing a turbulent molten material comprising a plurality of bubbles suspended in the molten material, the bubbles comprising at least some of the combustion products;
c) discharging the molten material comprising bubbles from the melter vessel through the melter exit structure into a forehearth; and
d) drawing the molten material comprising bubbles through a bushing fluidly connected to the forehearth to produce a glass fiber comprising a plurality of interior regions substantially devoid of glass.

A second aspect of this disclosure is a process comprising:
a) feeding at least one partially or wholly vitrifiable material into a feed inlet of a turbulent melting zone of a melter vessel comprising a floor, a ceiling, and a wall connecting the floor and ceiling at a perimeter of the floor and ceiling, the melter vessel comprising a feed opening in the wall or ceiling and an exit end comprising a melter exit structure for discharging molten material formed in the turbulent melting zone;

b) heating the at least one partially or wholly vitrifiable material with at least one burner directing combustion products of an oxidant and a first fuel into the turbulent melting zone under a level of the molten material in the zone, one or more of the burners configured to impart heat and turbulence to at least some of the molten material in the turbulent melting zone, producing a turbulent molten material comprising a plurality of bubbles suspended in the molten material, the bubbles comprising at least some of the combustion products;

c) discharging the molten material comprising bubbles from the melter vessel through the melter exit structure into a forehearth;

d) drawing the molten material comprising bubbles through a plurality of bushings producing glass fibers each comprising a plurality of interior regions devoid of glass, the fibers having substantially same outside diameter; and e) controlling flow of the molten material comprising bubbles through the forehearth and bushings so that fibers produced through the bushings are substantially consistent in volume of regions devoid of glass.

A third aspect of this disclosure is a system comprising:

a) a melter vessel comprising a floor, a ceiling, and a wall connecting the floor and ceiling at a perimeter of the floor and ceiling, the melter vessel comprising a feed opening in the wall or ceiling and an exit end comprising a melter exit structure for discharging molten material formed in a turbulent melting zone, and one or more burners, at least one of which is positioned to direct combustion products into the turbulent melting zone under a level of turbulent molten material in the turbulent melting zone;

b) a forehearth fluidly connected to the melter exit structure without any intervening channel or component, the forehearth comprising a plurality of bushings configured to produce glass fibers each comprising a plurality of interior regions devoid of glass, the fibers having substantially same outside diameter.

A fourth aspect of this disclosure is an apparatus comprising:

a first conduit comprising a first end, a second end, a longitudinal bore having a longitudinal axis, and an external surface;

a second conduit substantially concentric with the first conduit, the second conduit comprising a first end, a second end, and an internal surface;

the first and second conduits configured to form a primary annulus between the external surface of the first conduit and the internal surface of the second conduit;

a third substantially concentric conduit comprising a first end, a second end, and an internal surface, the internal surface of the third conduit forming, with an exterior surface of the second conduit, a secondary annulus external to the primary annulus;

a top end cap sealing the first ends of the second and third conduits, the second end of the second conduit sealed around the first conduit, and the second end of the third conduit sealed around the second conduit, forming a cavity for fluid to circulate;

one or more passages near the second end of the second conduit for passage of primary oxidant;

one or more alternate gas tubes extending substantially longitudinally through the secondary annulus and comprising distal ends terminating in at least one port near the first end of the second conduit; and one or more secondary fuel tubes extending substantially longitudinally through the primary annulus and comprising distal ends positioned near the first ends of the first and second conduits.

A fifth aspect of this disclosure is an apparatus comprising:

a first conduit comprising a first end, a second end, a longitudinal bore having a longitudinal axis, and an external surface, the first end comprising threads on the external surface, a second conduit substantially concentric with the first conduit, the second conduit comprising a first end, a second end, and an internal surface, the first and second conduits configured to form a primary annulus between the external surface of the first conduit and the internal surface of the second conduit;

a body having an upper surface, a lower surface, a circumferential surface abutting a portion of the internal surface of the second conduit, and a generally cylindrical central hub concentric with the longitudinal axis, the structure adjustable axially in relation to and threadedly attached to the threads of the first end of the first conduit via the hub, the hub defining a central passage having an exit at the upper surface, the body comprising one or more non-central through passages extending from the lower to the upper surface, the non-central passages configured such that flow of one or more fluids through the non-central passages causes the fluids to intersect with a flow of one or more other fluids in a mixing region above the upper surface of the body;

a third substantially concentric conduit comprising a first end, a second end, and an internal surface, the internal surface of the third conduit forming, with an exterior surface of the second conduit, a secondary annulus external to the primary annulus;

the first end of the third conduit extending beyond the first end of the second conduit, the first end of the second conduit extending beyond the first end of the first conduit, and the secondary annulus is capped by an end cap connecting the first end of the second conduit and the first end of the third conduit; and the second end of the second conduit sealed around the first conduit, and the second end of the third conduit sealed around the second conduit, forming a cavity for fluid to circulate.

Processes, systems, and apparatus of this disclosure will become more apparent upon review of the brief description of the drawings, the detailed description of the disclosure, and the claims that follow.

BRIEF DESCRIPTION OF THE DRAWINGS

The manner in which the objectives of the disclosure and other desirable characteristics can be obtained is explained in the following description and attached drawings in which:

FIGS. 7 and 8 are schematic cross-sectional views of two apparatus in accordance with the present disclosure;

FIGS. 7A and 8A are schematic plan views of the apparatus illustrated in FIGS. 7 and 8, respectively, while

Figure 1:
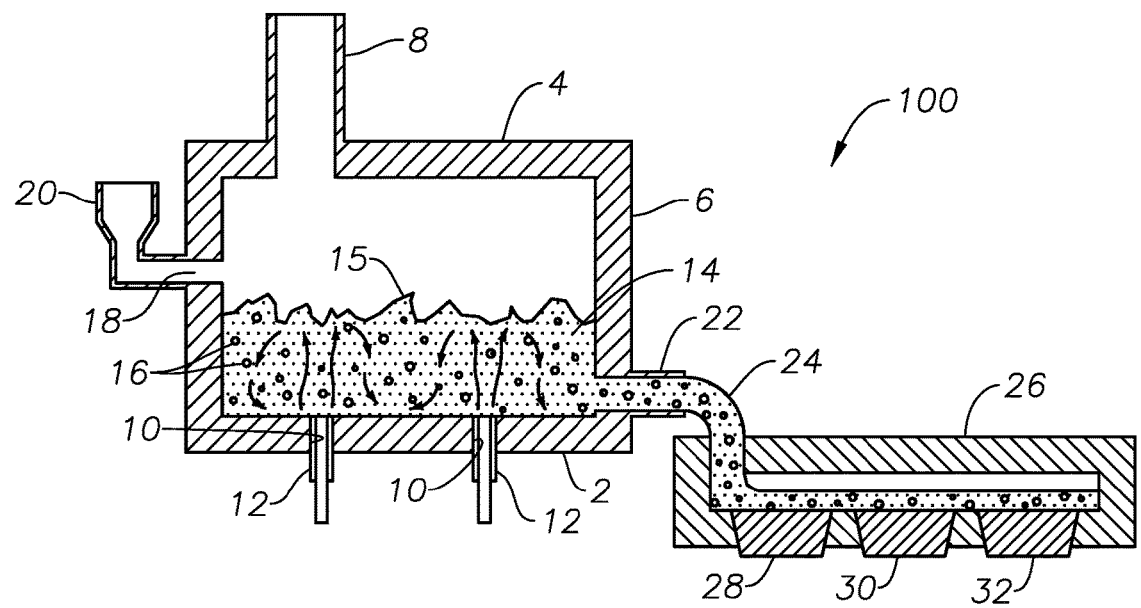
FIGS. 1, 2, and 3 illustrate schematic side elevation views, partially in cross-section, of three system embodiments in accordance with the present disclosure.

It is to be noted, however, that the appended drawings are not to scale and illustrate only typical embodiments of this disclosure, and are therefore not to be considered limiting of its scope, for the disclosure may admit to other equally effective embodiments.

DETAILED DESCRIPTION

In the following description, numerous details are set forth to provide an understanding of various, process, system, and apparatus embodiments in accordance with the present disclosure. However, it will be understood by those skilled in the art that the melter apparatus and processes of using same may be practiced without these details and that numerous variations or modifications from the described embodiments may be possible which are nevertheless considered within the appended claims. All U.S. published patent applications and U.S. Patents referenced herein are hereby explicitly incorporated herein by reference. In the event definitions of terms in the referenced patents and applications conflict with how those terms are defined in the present application, the definitions for those terms that are provided in the present application shall be deemed controlling.

Certain process embodiments may comprise controlling flow of the molten material comprising bubbles through the forehearth and bushings so that fibers produced through the bushings are substantially consistent in volume of regions devoid of glass. As used herein the phrase "substantially consistent in volume of regions devoid of glass" means that the fibers may be either random or non-random in the shape of their void regions, but that the fibers nevertheless have about the same volume of gas inclusions or bubbles. The gas inclusions or bubbles need not be round, and may be oblong or irregular in shape.

Certain system embodiments may comprise a forehearth fluidly connected to the melter exit structure without any intervening channel or component. As used herein the phrase "without any intervening channel or component" means the forehearth is directly connected to the melter exit structure without any refining channel in between the melter exit structure and forehearth. In certain embodiments, as explained further herein, a first forehearth may be fluidly connected to a second forehearth by a distribution channel.

The phrase "at least one burner directing combustion products of an oxidant and a first fuel into the melting zone under a level of the molten material in the zone" as used herein means that combustion gases emanate from burners under the level of the molten glass; the burners may be floor-mounted, wall-mounted, or in melter embodiments comprising more than one submerged combustion burner, any combination thereof (for example, two floor mounted burners and one wall mounted burner). As used herein the term "combustion gases" means substantially gaseous mixtures of combusted fuel, any excess oxidant, and combustion products, such as oxides of carbon (such as carbon monoxide, carbon dioxide), oxides of nitrogen, oxides of sulfur, and water. Combustion products may include liquids and solids, for example soot and unburned liquid fuels.

The phrase "turbulent melting zone" means that zone in a submerged combustion melter wherein there is very turbulent, sometimes extraordinarily turbulent conditions inside the submerge combustion melter. The phrase "turbulent molten material" means molten material that is in a condition of high turbulence, with many bubbles of combustion product gases and gases evolved from the glass batch materials becoming entrained in the molten material and some of the bubbles bursting as they reach the surface of the molten mass. This high degree of turbulence can increase the mechanical load on the melter vessel walls significantly, especially in embodiments where some or all of the walls are fluid-cooled, as fluid-cooled wall structures may be made thinner than non-cooled walls since the frozen or highly viscous glass layer formed thereon protects the walls better than non-cooled walls. Therefore, while there may be savings in cost of materials for submerged combustion melter vessels with thinner, fluid-cooled walls, and fuel savings due to better heat transfer to the melt, there may be adverse physical impacts on the melter structure due to the very high turbulence imparted during submerged combustion.

The phrase "glass batch" as used herein refers to the initial raw material, or glass source material, and may include any material suitable for forming molten glass such as, for example, limestone, glass, sand, soda ash, feldspar and mixtures thereof. It is important to recognize the difference between the glass batch composition and the glass forming ingredients or components of the glass batch. See for example "Glass Melting", *Battelle PNNL MST Handbook*, U.S. Department of Energy, Pacific Northwest Laboratory, retrieved Apr. 20, 2012. In one embodiment, a glass composition for producing glass fibers may be "E-glass," which typically includes 52-56% $SiO_2$, 12-16% $Al_2O_3$, 0-0.8% $Fe_2O_3$, 16-25% CaO, 0-6% MgO, 0-10% $B_2O_3$, 0-2% $Na_2O$+ $K_2O$, 0-1.5% $TiO_2$ and 0-1% $F_2$. Other glass compositions may be used, such as those described in Applicant's published U.S. applications 2007/0220922 and 2008/0276652. The initial raw material to provide these glass compositions can be calculated from information such as in Table 1, reproduced from the above 2007/0220922 application. Notice that during glass melting, carbon dioxide (from limestone ($CaCO_3$) and water (from borax ($Na_2B_4O_7*10H_2O$)) evaporate.

TABLE 1

| | A typical E-glass batch BATCH COMPOSITION (BY WEIGHT) | | | | | | | | | | |
|---|---|---|---|---|---|---|---|---|---|---|---|
| Raw material | Limestone (Baseline) | Quicklime | Ca Silicate | Volcanic Glass | Ca Silicate & Volcanic Glass | Quartz-free #1 | Quartz-free #2 | Limestone Slag | Ca Silicate Slag | Quartz-free #3 | Quartz and Clay Free | Ca Silicate/ Feldspar |
| Quartz (flint) | 31.3% | 35.9% | 15.2% | 22.6% | 8.5% | 0% | 0% | 22.3% | 5.7% | 0% | 0% | 19.9% |
| Kaolin Clay | 28.1% | 32.3% | 32.0% | 23.0% | 28.2% | 26.4% | 0% | 22.7% | 26.0% | 26.0% | 0% | 0% |
| BD Lime | 3.4% | 4.3% | 3.9% | 3.3% | 3.8% | 3.7% | 4.3% | 2.8% | 3.1% | 3.1% | 4.3% | 4.4% |

TABLE 1-continued

A typical E-glass batch
BATCH COMPOSITION (BY WEIGHT)

| Raw material | Limestone (Baseline) | Quicklime | Ca Silicate | Volcanic Glass | Ca Silicate & Volcanic Glass | Quartz-free #1 | Quartz-free #2 | Limestone Slag | Ca Silicate Slag | Quartz-free #3 | Quartz and Clay Free | Ca Silicate/Feldspar |
|---|---|---|---|---|---|---|---|---|---|---|---|---|
| Borax | 4.7% | 5.2% | 5.2% | 0% | 1.5% | 0% | 0% | 0% | 0% | 0% | 1.1% | 1.1% |
| Boric Acid | 3.2% | 3.9% | 3.6% | 7.3% | 6.9% | 8.2% | 8.6% | 7.3% | 8.2% | 8.2% | 7.7% | 7.8% |
| Salt Cake | 0.2% | 0.2% | 0.2% | 0.2% | 0.2% | 0.2% | 0.2% | 0.2% | 0.2% | 0.2% | 0.2% | 0.2% |
| Limestone | 29.1% | 0% | 0% | 28.7% | 0% | 0% | 0% | 27.9% | 0% | 0% | 0% | 0% |
| Quicklime | 0% | 18.3% | 0% | 0% | 0% | 0% | 0% | 0% | 0% | 0% | 0% | 0% |
| Calcium Silicate | 0% | 0% | 39.9% | 0% | 39.1% | 39.0% | 27.6% | 0% | 37.9% | 37.9% | 26.5% | 26.6% |
| Volcanic Glass | 0% | 0% | 0% | 14.9% | 11.8% | 17.0% | 4.2% | 14.7% | 16.8% | 16.8% | 0% | 0% |
| Diatomaceous Earth (DE) | | | | | | 5.5% | 17.4% | 0% | 0% | 5.7% | 20.0% | 0% |
| Plagioclase Feldspar | | | | | | 0% | 38.3% | 0% | 0% | 0% | 40.1% | 40.1% |
| Slag | | | | | | 0% | 0% | 2.0% | 2.0% | 2.0% | 0% | 0% |
| Total | 100% | 100% | 100% | 100% | 100% | 100% | 100% | 100% | 100% | 100% | 100% | 100% |
| Volume of CO2@ 1400 C. | 1668 | 0 | 0 | 1647 | 0 | 0 | 0 | 1624 | 0 | 0 | 0 | 0 |

The term "air-fuel burner" means a combustion burner that combusts one or more fuels with only air, while the term "oxy-fuel burner" means a combustion burner that combusts one or more fuels with either oxygen alone, or employs oxygen-enriched air, or some other combination of air and oxygen, including combustion burners where the primary oxidant is air, and secondary and tertiary oxidants are oxygen. Burners may be comprised of metal, ceramic, ceramic-lined metal, or combination thereof. "Air" as used herein includes ambient air as well as gases having the same molar concentration of oxygen as air. "Oxygen-enriched air" means air having oxygen concentration greater than 21 mole percent. "Oxygen" includes "pure" oxygen, such as industrial grade oxygen, food grade oxygen, and cryogenic oxygen. Oxygen-enriched air may have 50 mole percent or more oxygen, and in certain embodiments may be 90 mole percent or more oxygen. Oxidants such as air, oxygen-enriched air, and pure oxygen may be supplied from a pipeline, cylinders, storage facility, cryogenic air separation unit, membrane permeation separator, or adsorption unit.

The term "fuel", according to this disclosure, means a combustible composition (either in gaseous, liquid, or solid form, or any flowable combination of these) comprising a major portion of, for example, methane, natural gas, liquefied natural gas, propane, atomized oil, powders or the like. Fuels useful in the disclosure may comprise minor amounts of non-fuels therein, including oxidants, for purposes such as premixing the fuel with the oxidant, or atomizing liquid fuels. The terms "first" or "primary" fuel, and "second" or "secondary" fuel mean that the first fuel and second fuel have different compositions and/or physical characteristics, although they may have overlapping components, and may have some similar physical characteristics. For example, natural gas as a primary fuel may include some butane, and butane may be employed as a secondary fuel. Tertiary fuels may also be used, that is, more than two fuels. The term "alternate gas" includes reactive gases and inert gases, and mixtures thereof, substances that are gases at ambient conditions, as well as compounds that are liquids at ambient conditions, but that vaporize at temperatures in a submerged combustion melter, such as carbon disulfide. Reactive gases include, but are not limited to, carbon dioxide, carbon monoxide, nitrous oxide, nitrous oxide, oxides of sulfur, fluorine, chlorine, silane, and the like. Inert gases include, but are not limited to, gases such as nitrogen, argon, xenon, and the like.

At least some of the burners may be floor-mounted, and in certain embodiments the floor-mounted burners may be positioned in one or more parallel rows substantially perpendicular to a longitudinal axis of the melter. In certain embodiments, the number of floor-mounted burners in each row may be proportional to width of the melter. In certain embodiments the depth of the melter may decrease as width of the melter decreases. In certain other embodiments, an intermediate location may comprise a constant width zone positioned between an expanding zone and a narrowing zone of the melter, in accordance with Applicant's U.S. Pat. No. 8,769,992.

At least some of the burners may be oxy-fuel burners. In certain embodiments the oxy-fuel burners may comprise one or more submerged oxy-fuel combustion burners each having co-axial fuel and oxidant tubes forming an annular space there between, wherein the outer tube extends beyond the end of the inner tube, as taught in U.S. Pat. No. 7,273,583. In certain other embodiments the oxy-fuel burners may comprise one or more adjustable flame submerged oxy-fuel combustion burners as taught in Applicant's U.S. Pat. No. 8,875,544. In certain embodiments, the burners may be modified as described herein to provide one or more conduits or tubes for supplying a secondary, tertiary or lower order fuel, or alternative gas species, to control or modify parameters of gaseous inclusions in the fibers produced.

In certain embodiments, the melter apparatus may have a floor size for a given throughput of 2 ft$^2$/stpd or less, and in certain embodiment may have a floor size for a given throughput of 0.5 ft$^2$/stpd or less, where "stpd" means "short tons per day." Stated differently, in certain embodiments, the methods herein may comprise discharging at least 0.5 short tons per day per square foot of melter floor, and in certain exemplary processes, at least 2 short tons per day per square foot of melter floor. The entrainment of one or more gases within the fibers may reduce the amount of glass necessary to generate a specific length or volumetric quantity of fiber, which may reduce the overall cost. Also, by utilizing glass that has a void fraction of gaseous bubbles for fiberization, the need for expensive and energy intensive downstream equipment and processes to remove or "fine" the glass is unnecessary, resulting in improved capital costs.

Certain exemplary processes and systems of this disclosure may comprise cooling various components using fluid-cooled refractory panels and directing a heat transfer fluid through the panels. The term "fluid-cooled" means cooling using gaseous, liquid, or combination thereof, heat transfer media. The wall may comprise a refractory liner at least between the fluid-cooled panels and the molten glass. In certain embodiments, the refractory cooled-panels comprising the walls of the melter vessel, the fluid-cooled skimmer, and fluid-cooled dams, may be cooled by a heat transfer fluid selected from the group consisting of gaseous, liquid, or combinations of gaseous and liquid compositions that functions or is capable of being modified to function as a heat transfer fluid. Different cooling fluids may be used in the various components, or separate portions of the same cooling composition may be employed in all components. Gaseous heat transfer fluids may be selected from air, including ambient air and treated air (for air treated to remove moisture), inert inorganic gases, such as nitrogen, argon, and helium, inert organic gases such as fluoro-, chloro- and chlorofluorocarbons, including perfluorinated versions, such as tetrafluoromethane, and hexafluoroethane, and tetrafluoroethylene, and the like, and mixtures of inert gases with small portions of non-inert gases, such as hydrogen. Heat transfer liquids may be selected from inert liquids, which may be organic, inorganic, or some combination thereof, for example, salt solutions, glycol solutions, oils and the like. Other possible heat transfer fluids include steam (if cooler than the oxygen manifold temperature), carbon dioxide, or mixtures thereof with nitrogen. Heat transfer fluids may be compositions comprising both gas and liquid phases, such as the higher chlorofluorocarbons.

Conduits, tubes, and adjustable, changeable, removable bodies used in burners of the present disclosure may be comprised of metal, ceramic, ceramic-lined metal, or combination thereof. Suitable metals include stainless steels, for example, but not limited to, 306 and 316 steel, as well as titanium alloys, aluminum alloys, and the like.

Referring now to the figures, FIG. 1 illustrates system embodiment 100 comprising a melter having a floor 2, a roof or ceiling 4, a wall 6 having a feed opening 18, and a feeder 20 for feeding batch, cullet, waste material, or combination thereof. System embodiment 100 further includes an exhaust stack 8, and openings 10 for two (or more, not illustrated) floor-mounted and/or sidewall-mounted submerged combustion burners 12, which create during operation a highly turbulent melt indicated at 14, with a turbulent surface 15. In certain embodiments, floor-mounted burners 12 may be positioned to emit combustion products into molten glass in the melting zone 14 in a fashion so that the gases penetrate the melt generally perpendicularly to floor 2. In other embodiments, one or more floor-mounted burners 12 may emit combustion products into the melt at an angle to floor 2, where the angle may be more or less than 45 degrees, but in certain embodiments may be 30 degrees, or 40 degrees, or 50 degrees, or 60 degrees, or 70 degrees, or 80 degrees. Burners 12 may be air-fuel burners or oxy-fuel burners, or some combination thereof, or apparatus as further described in relation to FIGS. 7 and 8 herein. Embodiment 100 further includes a melter exit structure 22 for discharging the molten glass or similar material 24 including a plurality of gaseous bubbles 16 directly into a forehearth 26. Melter exit structure 22 is positioned generally downstream of melter turbulent zone 14 as illustrated of FIG. 1, and may or may not be mechanically connected to forehearth 26. Importantly, no molten glass conditioning channel is included between melter exit structure 22 and forehearth 26. Completing system 100 are one or more bushings on a lower portion of forehearth 26, system 100 having three bushings 28, 30, and 32, for producing hollow fibers, or fibers having regions substantially devoid of glass. Examples of fibers producible using systems, processes and burner apparatus of this disclosure are illustrated schematically in FIGS. 6A-D.

System 100, and other systems of this disclosure, may comprise a source chamber for sourcing raw feed materials (for example glass batch) and a feed processing unit, such as described in Applicant's U.S. Pat. No. 9,643,869. In these embodiments, the source chamber defines an initial environment, while feed processing unit defines a second environment. In initial environment the feed materials are at a first density, while in second environment the feed materials are transformed to have a second density greater than the first density, as well as having a degree of compaction, at least surface compaction, that work together to reduce fines from escaping up melter exhaust 8 during operation of the systems.

The initial raw material may be introduced into, and molten glass with bubbles may be produced from the melters of systems of the present disclosure on a batch, semi-continuous or continuous basis. The amount of the initial raw material introduced into the melter is generally a function of, for example, the capacity and operating conditions of the melter as well as the rate at which the molten material is removed from the melter.

The initial raw material may include any material suitable for forming molten glass such as, for example, glass batches comprising combinations of limestone, sand, trona, lime, albite, orthoclase dolomite, borax, soda ash, feldspar, and the like, and mixtures thereof. In certain embodiments, the initial raw materials may include batch components suitable for producing "E-glass" fibers, which typically include 52-56% $SiO_2$, 12-16% $Al_2O_3$, 0-0.8% $Fe_2O_3$, 16-25% CaO, 0-6% MgO, 0-10% $B_2O_3$, 0-2% $Na_2O+K_2O$, 0-1.5% $TiO_2$ and 0-1% $F_2$. Other glass compositions may be used, such as those described in Applicant's published U.S. application 2008/0276652. The initial raw material can be provided in any form such as, for example, relatively small particles.

Figure 2:
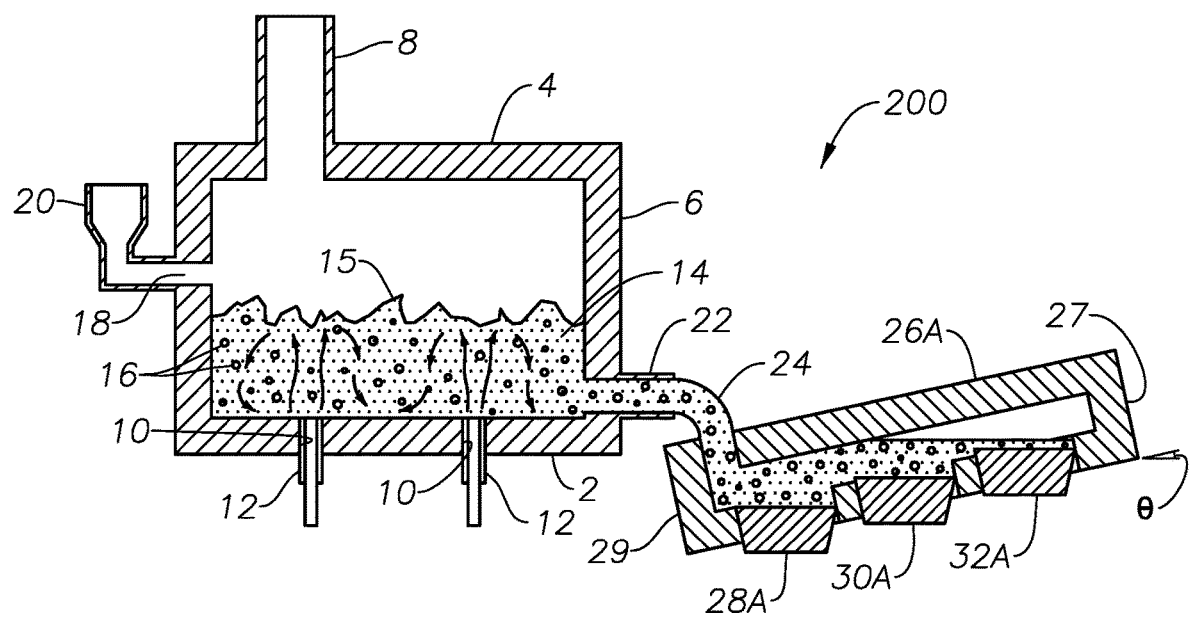

Referring now to FIG. 2, system embodiment 200 illustrated schematically in FIG. 2 is similar to embodiment 100 illustrated schematically in FIG. 1, except that forehearth 26A is angled at an incline angle "θ" to horizontal, where incline angle θ may range from about 5 to about 45 degrees, or from about 5 to about 25 degrees, or from about 5 to about 20 degrees. The result is that a distal end 26B of forehearth 26A is raised above a proximate end 26C. Forehearth 26A may either be installed at a permanent incline angle or variable incline angle, for example by using adjustable components such as jack screws, hydraulic or pneumatic cylinders, and the like. Installing the forehearth at an incline angle enables more consistent bubble entrainment within the glass and therefore more consistent hollow fiber production. Bubbles will generally rise within the molten glass, and the rate of bubble rise may be numerically modeled. The incline angle θ of the forehearth 26A, along with geometric features of the forehearth and positioning of bushings 28A, 30A, and 32A may be manipulated to maintain substantially consistent void fraction within the fibers produced. Geometric features that may be manipulated include, but are not limited to, the incline angle, the length and width of the forehearth, glass depth in the forehearth as a function of length along the forehearth, the angle to horizontal of bushings, and the like. In embodiment 200, bushings 28A, 30A, and 32A are each level to horizontal, but this is not necessarily so. Surprisingly, contrary to common sense, the production rate of hollow fibers is not greatly affected by increasing the incline angle.

Figure 3:
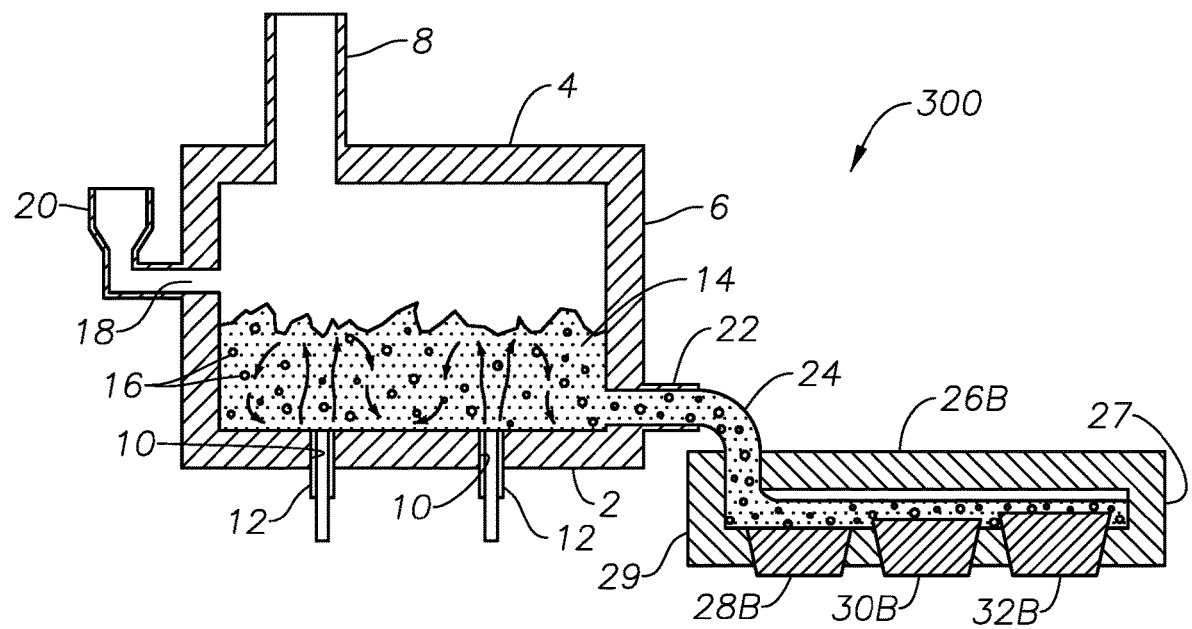

System embodiment 300 illustrated schematically in FIG. 3 is similar to embodiments 100 and 200 illustrated schematically in FIGS. 1 and 2, except that embodiment 300 has its forehearth 26B positioned horizontally, while bushings 28B, 30B, and 32B are positioned so that their inlets are successively higher toward distal end 27 than toward proximate end 29 of forehearth 26B. In this arrangement, as bubbles rise in the molten glass as the molten glass travels through forehearth 26B, the fraction of bubbles in glass near the top of the molten glass should have more bubbles than in the lower levels of the glass in forehearth 26B. Therefore, fiber produced through bushing 28B should have more bubbles than fiber produced through bushing 30B, and fiber produced through bushing 30B should have more bubbles than fiber produced through bushing 32B. In this way, fiber of varying void fraction may be produced using the same feed material, melter and forehearth.

In certain systems and processes of the present disclosure, a frozen and/or highly viscous glass layer or layers may be formed on the inside surfaces of wall 6 due to the use of fluid-cooled panels for these walls. One or more or all of wall 6, floor 2, and roof 4 may be comprised of a metal shell and a fluid-cooled refractory panel, not illustrated in the figures.

Melter exit structure 22 for discharging the molten glass or similar material is provided in systems 100, 20, and 300. Melter exit structure 22 may fluidly and mechanically connect the melter vessel to a forehearth 26, 26A, or 26B. Melter exit structure 22 may comprise a fluid-cooled transition channel, having generally rectangular cross-section, although any other cross-sections would suffice, such as hexagonal, trapezoidal, oval, circular, and the like. Regardless of cross-sectional shape, melter exit structure 22 may be fluid-cooled and configured to form a frozen glass layer or highly viscous glass layer, or combination thereof, on inner surfaces of structure 22 and thus protect melter exit structure 22 from the mechanical energy imparted from the melter vessel to melter exit structure 22.

A fluid-cooled skimmer (not illustrated) may be provided, extending downward from the ceiling of the melter vessel and positioned upstream of melter exit structure 22. A fluid-cooled skimmer, if present, may have a lower distal end extending a distance ranging from about 1 inch to about 12 inches (from about 2.5 cm to about 30 cm) below the average melt level in the melter. The fluid-cooled skimmer may be configured to form a frozen glass layer or highly viscous glass layer, or combination thereof, on its outer surfaces. The skimmer lower distal end may define, in conjunction with the floor of the melter, a throat of the melter vessel configured to control flow of molten glass from the melter vessel into melter exit structure 22. Preferably, the throat is arranged below average melt level. Molten material can be removed from melter exit structure 22 on a batch, semi-continuous basis or continuous basis. In an exemplary embodiment, the molten material including a plurality of bubbles continuously flows through the throat and generally horizontally through melter exit structure 22, and is removed continuously from melter exit structure to a forehearth. Thereafter, the molten material can be processed by any suitable technique, for example, a process for forming hollow glass fibers.

Certain embodiments may include an overlapping refractory material layer on at least the inner surface of fluid-cooled transition channel that are exposed to molten material. In certain embodiments the overlapping refractory material may comprise a seamless insert of dense chrome, molybdenum, or other dense ceramic or metallic material. The dense chrome or other refractory material may be inserted into the melter exit structure and may provide a seamless transition from the melter vessel to a forehearth.

Figure 4:
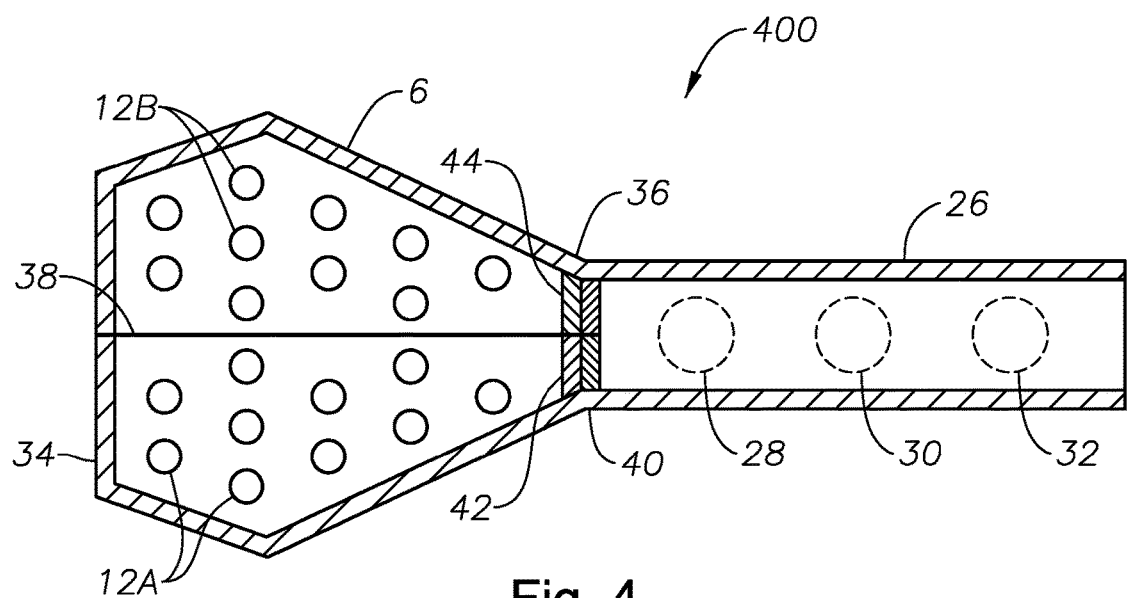
FIGS. 4 and 5 illustrate schematic plan views, partially in cross-section, of two system embodiments in accordance with the present disclosure.
Figure 5:
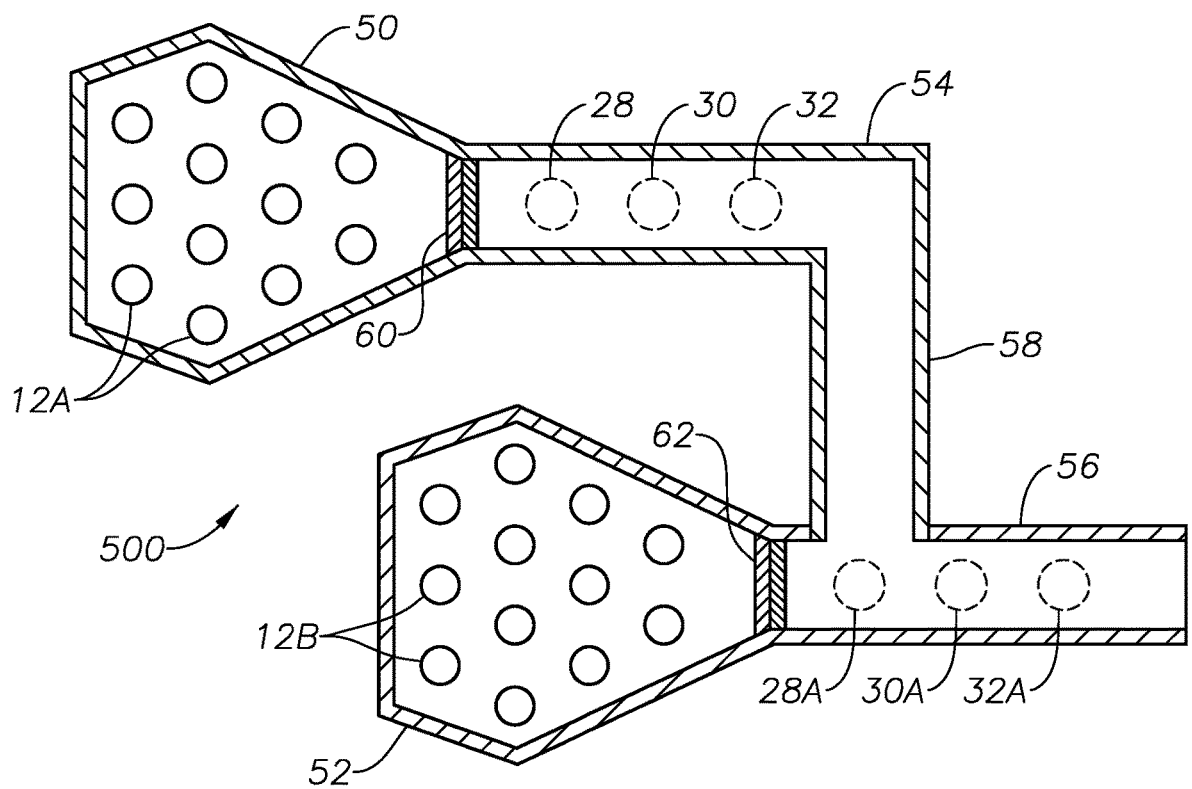

Referring to FIGS. 4 and 5, another optional feature of systems in accordance with the present disclosure is the provision of one or more fluid-cooled dam(s) in the upper wall or ceiling of melt exit structure 22, such as dams 42, 44 illustrated schematically in the plan view of embodiment 400 in FIG. 4, and dams 60, 62 illustrated schematically in the plan view of embodiment 500 in FIG. 5. The submerged combustion melter (SCM) of embodiment 400 includes a feed end 34, a discharge end 36, a partition 38, and a plurality of floor-mounted burners 12. Forehearth 26 includes an entrance end 40 and bushing 28, 30, and 32 for producing E-glass of other glass fibers. Fluid-cooled dams 42, 44 would be accommodated by respective dam openings (not illustrated in FIG. 4) in the roof or ceiling of the melter. System 500 illustrated schematically in FIG. 5 includes a first SCM 50, a second SCM 52, a first forehearth 54 fluidly and mechanically connected to first SCM 50, and a second forehearth 56 fluidly and mechanically connected to second SCM 52. First forehearth 54 is in turn fluidly and mechanically connected to second forehearth 56 via a channel 58.

Embodiments 400 and 500 and those similar thereto may be employed to produce fibers having different gaseous compositions of bubbles or regions devoid of glass. For example, referring again to FIG. 4, dam 42 may be open while dam 44 is closed, and gas A may be injected into one or more burners 12A, then dam 42 may be closed and dam 44 opened while gas B may be injected into one or more burners 12B. Similarly, referring again to FIG. 5, dam 60 may be open while dam 62 is closed, and gas A may be injected into one or more burners 12A, then dam 60 closed and dam 62 opened while gas B may be injected into one or more burners 12B.

Dams 42, 44, 60, and 62 may be manipulated by a prime mover, such as one or more motors, jack screws, hydraulic or pneumatic cylinders or the like. Fluid-cooled dams may comprise dimensions allowing the dam(s) to be extended an entire distance from ceiling to floor of the melter and completely isolate the melting zones of the melter vessel from the forehearth.

Figure 6A:
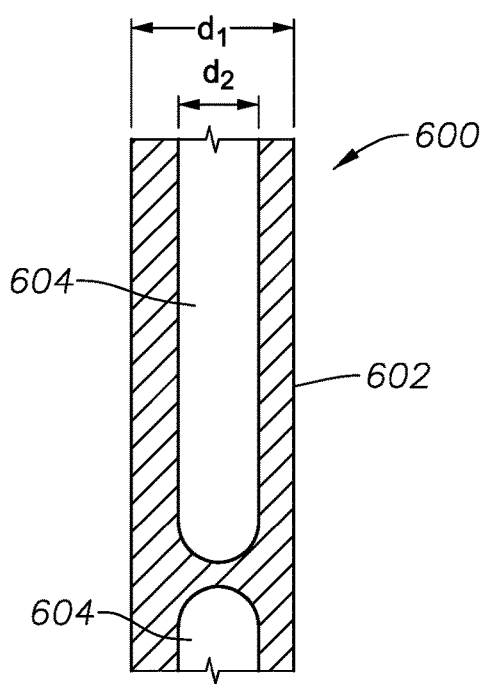
FIGS. 6A and 6B illustrate schematic enlarged cross-sectional views of two different fibers made using the processes, systems, and apparatus of the present disclosure.
Figure 6B:
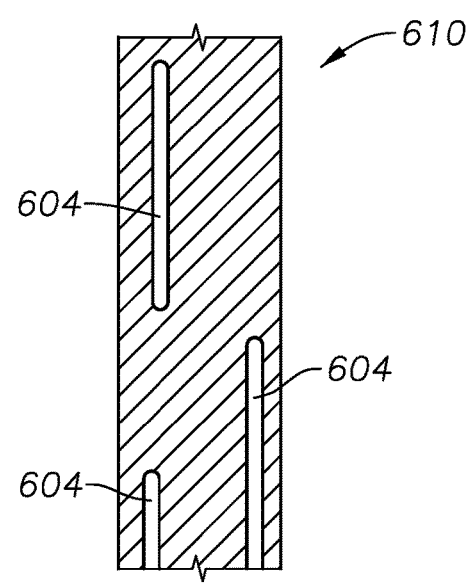

FIGS. 6A and 6B illustrate schematically fiber embodiments 600 and 610, respectively that may be produced using processes, systems, and apparatus of the present disclosure. The illustrations are enlargements of actual fibers. During production of the fiber, molten glass with entrained bubbles is extruded through orifices or nozzles in heated bushings. During this process the molten glass and bubbles are attenuated (stretched) so that the generally spherical bubbles are transformed into generally oblong shaped gaseous regions, 604. If the bubbles are large, the gaseous regions may form along the central longitudinal axis of the fiber and may appear as illustrated in embodiment 600 of FIG. 6A. If the bubbles are smaller, the gaseous regions may form generally randomly, radially away from the central longitudinal axis of the fiber, and may appear as illustrated in FIG. 6B. Fiber outer diameter, "$d_1$," may range from about 4 micrometers to about 40 micrometers, while the diameter of the gaseous regions, "$d2$", may range from about 30 micrometers in embodiment 600 down to about 4 micrometers in embodiment 610. Large fiber diameter $d_1$ will generally allow larger gaseous region diameter, $d_2$, but the latter is highly dependent on the condition of the molten glass just prior to entering the bushing.

Figure 7:
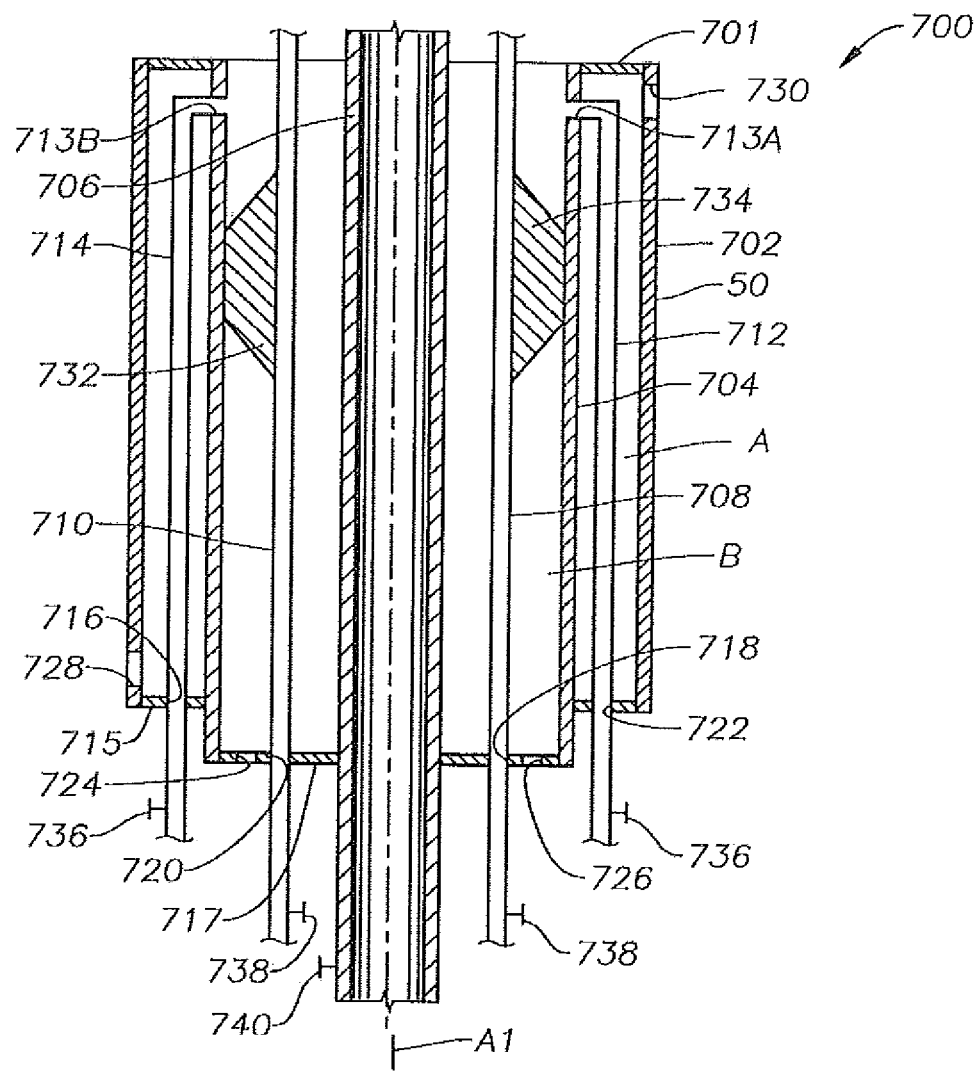
Figure 7A:
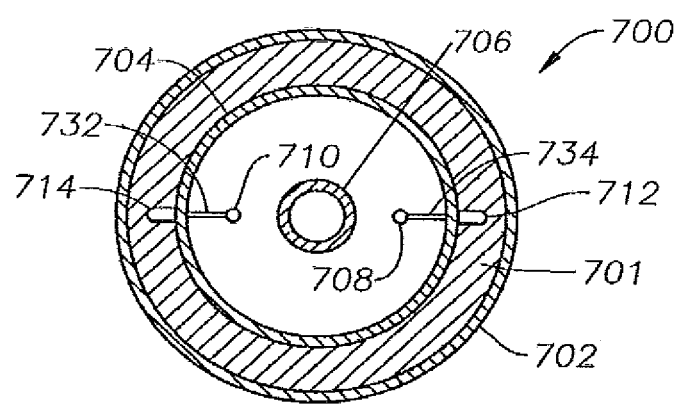
Figure 8A:
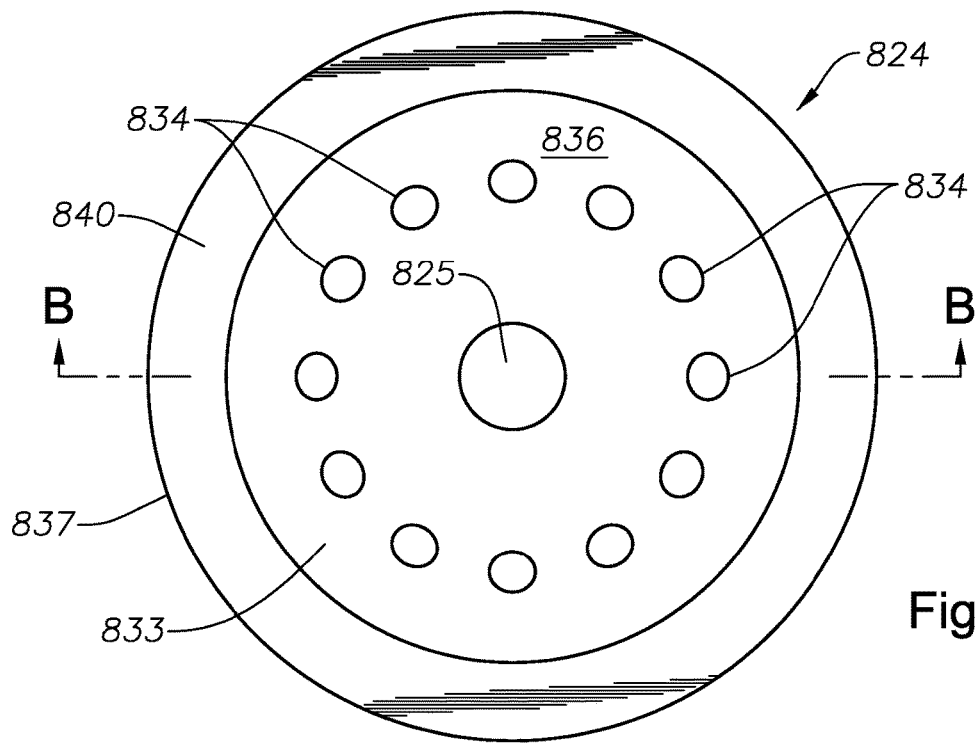
Figure 8B:
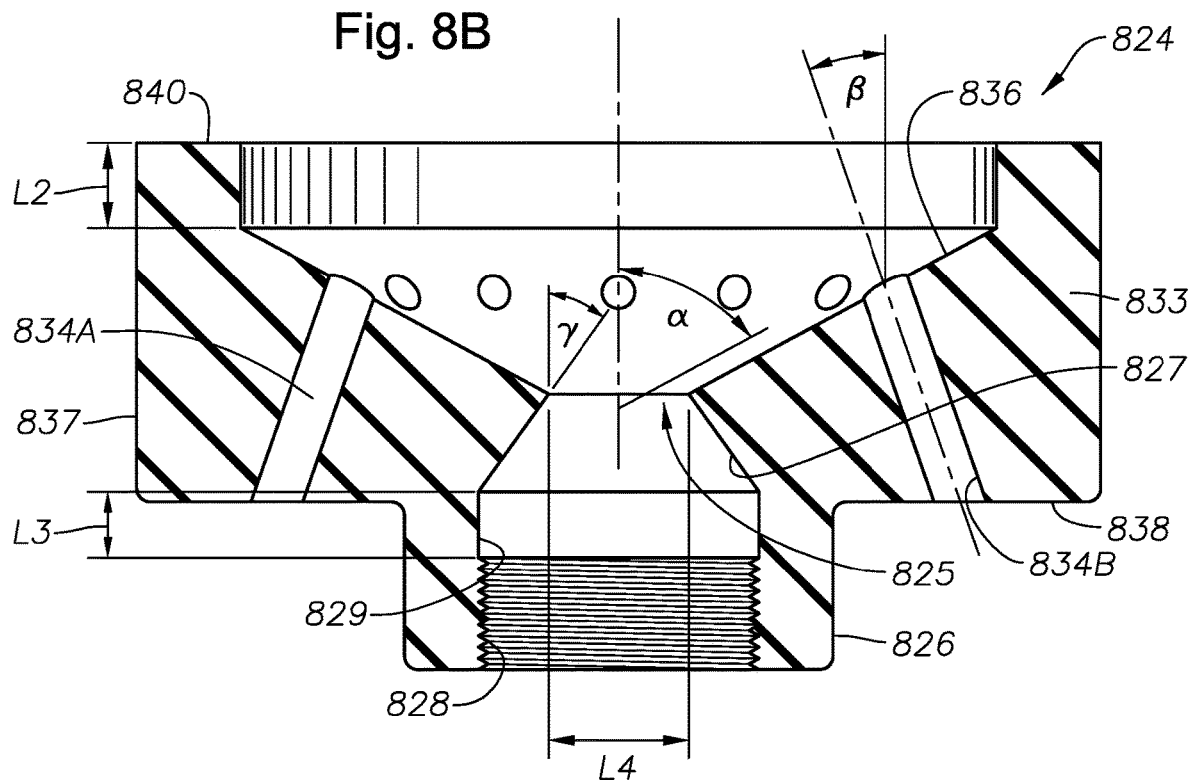
FIG. 8B is a cross-sectional view of a component of the burner illustrated schematically in FIGS. 8 and 8A.

FIGS. 7 and 8 are schematic cross-sectional views of two apparatus in accordance with the present disclosure, and FIGS. 7A and 8A are schematic plan views of the apparatus illustrated in FIGS. 7 and 8, respectively. FIG. 8B is a cross-sectional view of a component of the burner illustrated schematically in FIGS. 8 and 8A. Referring first to FIGS. 7 and 7A, apparatus embodiment 700 includes a top end plate 701, a water jacket/outer tube or conduit 702, a main or primary oxidant conduit 704, and a main or primary fuel conduit 706. Conduits 702, 704, and 706 are generally concentric about a central longitudinal axis "A1", and create an outer or secondary annulus "A", and an inner or primary annulus "B". In accordance with apparatus embodiment 700, one or more secondary fuel conduits 708, 710 may be provided. Conduit 708 is positioned in a thru-hole 718 in a second end plate 717, while conduit 710 is similarly positioned in a thru-hole 720 in second end plate 717. Second plate 717 further comprises thru-holes 724, 726 for allowing primary oxidant to pass into inner or primary annulus B. Optional brackets 732, 734 may be provided for structural support. Valves 738 may be provided to control and/or adjust flow of secondary fuel through conduits 708, 710.

As noted herein, in certain embodiments it may be beneficial to inject alternative, non-fuel gas species into molten glass produced by an SCM. One or more tubes or conduits 712, 714 may be provided for this purpose, as illustrated schematically in FIGS. 7 and 7A. Tubes or conduits 712, 714 may terminate near the flow exit of annulus B in ports 713A, 713B, respectively, positioned in primary oxidant conduit 704. Conduits 712, 714 may be positioned in thru-holes 722, 716, respectively, in a first end plate 715. Optional valves 736 may be provided to control and/or adjust flow of alternate gas species through conduits 712, 714. Thru-holes 728, 730 allow a cooling fluid such as water to enter and exit outer annulus A for cooling. One or more valves 740 may be provided to control in-flow of primary fuel. FIG. 7A provides a schematic plan view of apparatus embodiment 700. Of course, more or less than two alternative gas species conduits may be provided, as may more or less than two secondary fuel conduits.

Referring now to FIGS. 8, 8A and 8B, an alternate apparatus embodiment 800 includes an inner or first conduit 802 serving as a primary fuel conduit having an inlet 803, and an outer or second conduit 804 serving as a primary oxidant conduit having one or more inlet thru-holes 817, 819 in a bottom plate 814. This arrangement may be more typical for air-fuel combustion, but oxy-fuel combustion is contemplated as well. Inner conduit 802 defines a longitudinal bore 806 having a longitudinal axis A1, and inner conduit 802 and outer conduit 804 define a primary annulus "B" between them. A third conduit 810 forms an outer body of apparatus embodiment 800, with a cavity or secondary annulus "A" formed between third conduit 810 and second conduit 804. An end cap 813 defines an upper tip 811 of apparatus embodiment 800, which may be generally doughnut-shaped, or other shape. End cap 813 may be integral with outer conduit 810 as illustrated, or may be a separate component attached to outer conduit 810 and inner conduit 804 via threads, screws, rivets, and the like. Bottom plate 814 is included in embodiment 800, with slight structural differences, and may include threads or other removable fastener to secure bottom plate 814 to conduit 804. Thru-holes 816, 818 are provided in bottom plate 814 in embodiment 800 for accommodating tubes or conduits 808 (for secondary fuel), 812 (for alternate non-fuel gas species), as well as coolant fluid inlet 820 and outlet 822 in outer conduit 810. Embodiments employing more than one coolant inlet and more than one coolant outlet are considered within the disclosure, but may not be necessary in all circumstances. Embodiment 800 may includes a plenum for delivering a fluid into primary annulus B, although a plenum may not be necessary in all embodiments. For example, where oxygen or oxygen-enriched gas is used as an oxidant, the present disclosure contemplates embodiments where two or more oxygen supply conduits feed primary annulus B.

Another component of burner embodiments of the present disclosure is an adjustable, changeable and removable structure or insert, designated 824 in FIGS. 8, 8A, and 8B. Body 824 is adjustable in the sense that threads 828 or other connectors to inner conduit 802 allow variation of the axial position of insert 824. Furthermore, physical parameters of insert 824 may be changed, as discussed herein. Finally, the entire insert may be removed and replaced with another insert of same or different dimensions if desired.

Insert 824 includes a body 833 having a central hub 826 that is, in certain embodiments, parallel to longitudinal axis A1, but not necessarily so, hub 826 including a central passage having an exit 825 that is, in certain embodiments, perpendicular to longitudinal axis A1, but not necessarily so. Body 833 includes an upper surface 836 and a lower surface 838, and one or more non-central passages 834. In FIGS. 8 and 8B, two of the non-central passages 834A and 834B are visible. Upper surface 836 helps define, along with end cap 813, a mixing region 809 where fluids emanating from central exit 825, which may be a fuel stream, and non-central passages 834, which may be oxidant streams, at least partially mix. The streams may be switched in certain embodiments (in other words, fuel may traverse one or more non-central passages 834 while oxidant emanates from central exit 825). In embodiments where the oxidant flows through the central passage, the flame shape may be broader and the velocity of the combustion products lower in the vertical direction to enable more combustion and energy release lower in the molten glass pool to enhance efficiency. Body 824 further includes a circumferential surface 837 that is adjacent a portion of the inner surface of second conduit 804, near the upper end of second conduit 804.

As illustrated in embodiment 800, body 824 may include a circumferential lip 840 that abuts against an overhang portion 815 of end cap 813. End cap 813 has a length or height L1, and lip 840 has a length L2 from overhang portion 815 to upper surface 836 of body 824, where L2 may range from about 0.25 inch to about 2 inches. Circumferential lip extension 840 extends away from upper surface 836 of body 824 and generally parallel to longitudinal axis L1. End cap 813 may extend above exit 825 of the substantially central passage of hub 826 a distance L1, which may range from about 0.5 inch to about 6 inches. Vertical connector section 829 may have a length L3 ranging from about 0.25 inch to about 1 inch. As illustrated in FIG. 8B, exit 825 of the substantially central passage has a diameter L4. L4 may range from about 0.25 inch to about 3.0 inches. Lengths L1, L2, L3, and L4 are parameters that may be changeable and/or adjustable (as those terms are defined herein) in certain embodiments to achieve desired results, for example flame length, and may be interdependent. For example, length L1 may be adjustable and changeable, while lengths L2, L3, and L4 are only changeable from burner to burner.

Hub 826 includes, in embodiment 800, an angled or tapered section 827 connecting exit 825 and a vertical connector section 829 that connects angled section 827 with a threaded section 828. Threads on threaded section 828 mate with corresponding threads 830 on an upper end 832 of inner conduit 802. This threaded connection allows removal of insert 824 and/or adjustment of burner parameters, as discussed further herein.

FIGS. 8 and 8B illustrate three angles α, β, and γ, one or more of which may be changeable features in burners of the present disclosure. As used herein the word "changeable", when referring to a burner feature, means that that feature may be physically different from burner to burner by machining or molding, for example, while the term "adjustable" means that a feature of a burner may actually be varied without making physical modifications to the burner. Angle α is an angle that upper surface 836 of body 833 makes with longitudinal axis L1, and may range from about 45 to about 90 degrees. As illustrated in embodiment 800, in certain embodiments the non-central passages are generally linear and angled at an angle β measured from the longitudinal axis, the β angle ranging from about 10 degrees to about 45 degrees. As illustrated in embodiment 800 of FIGS. 8 and 8B, the substantially central passage may comprise an angled section 827 and a vertical connector section 829 connecting angled section 827 with threaded section 828 of hub 826. Angled section 827 may form an angle γ to longitudinal axis L1 ranging from about 10 degrees to about 45 degrees.

FIG. 8B is a cross-sectional view of component 824 of an adjustable, removable component of the burners of FIG. 8 and taken along the line B-B of FIG. 8A, which is a plan view of the same embodiment.

In certain embodiments, embodiment 800 may include one or more optional tubes or conduits 823 for admitting a non-fuel gas species through annulus A. A corresponding number of thru-holes or ports 823A would be provided in these embodiments in a bottom portion 841 of conduit 810.

In embodiment 800, various constructions may be envisioned that would provide the adjustment feature for adjustable component 824 and the options for introducing a secondary fuel and/or alternate non-fuel gas species. Tubes 808, 812 may be welded or brazed to component 824 so that the tubes line up with the non-central passages 834. Component 824 could be snuggly yet relatively loosely positioned inside of conduit 804, and the whole weldment comprising component 824 and tubes 808, 812 rotated as desired. Numerous other operable constructions would be possible and within this disclosure.

Figure 9:
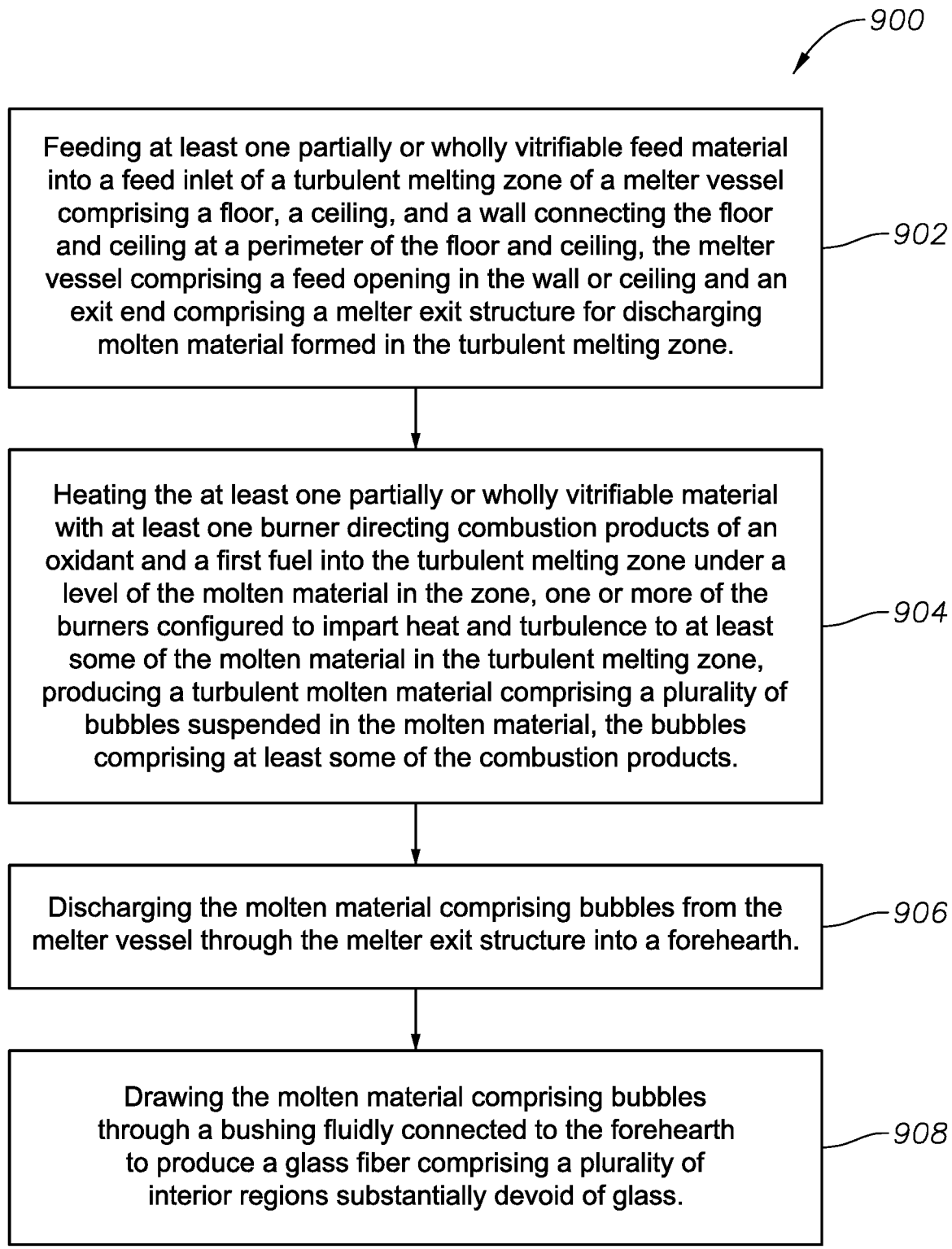
FIGS. 9, 10, and 11 are logic diagrams illustrating processes in accordance with the present disclosure.
Figure 10:
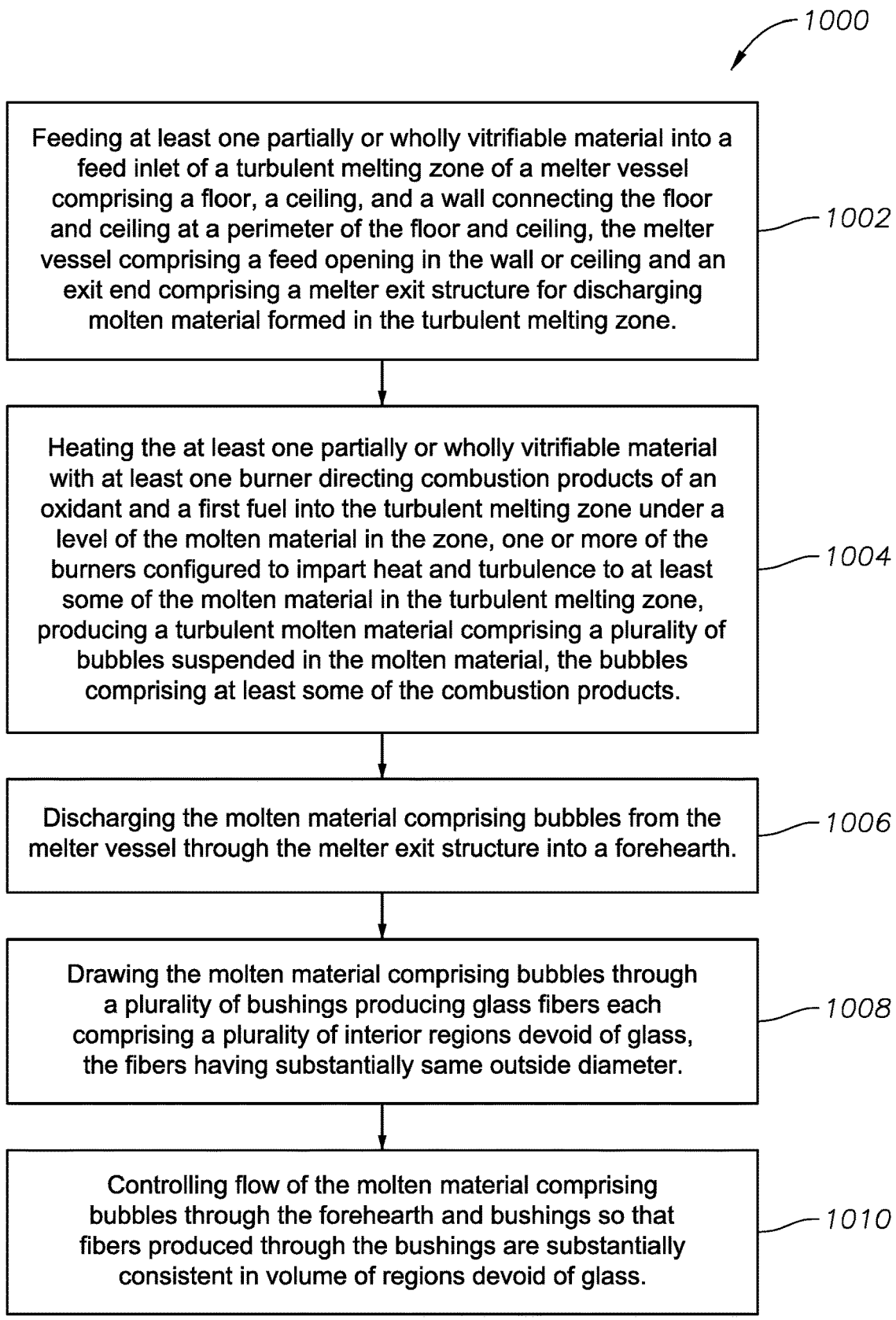
Figure 11:
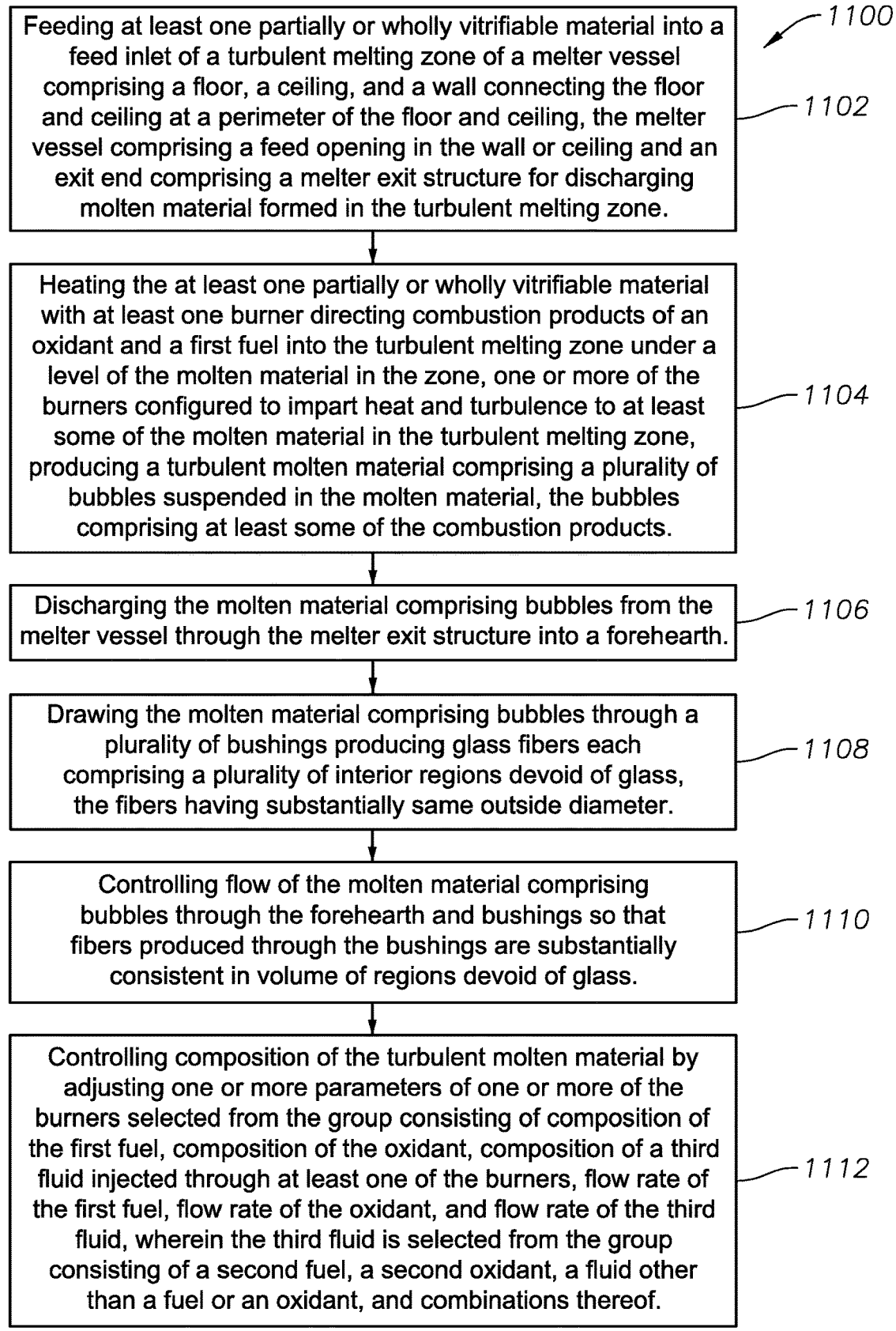

FIGS. 9, 10, and 11 are logic diagrams illustrating three non-limiting processes in accordance with the present disclosure. It should be emphasized that all steps of the various process embodiments need not be carried out in series or succession. Process embodiment 900 of FIG. 9 includes the step of feeding at least one partially or wholly vitrifiable feed material into a feed inlet of a turbulent melting zone of a melter vessel comprising a floor, a ceiling, and a wall connecting the floor and ceiling at a perimeter of the floor and ceiling, the melter vessel comprising a feed opening in the wall or ceiling and an exit end comprising a melter exit structure for discharging molten material formed in the turbulent melting zone (box 902). Embodiment 900 further includes heating the at least one partially or wholly vitrifiable material with at least one burner directing combustion products of an oxidant and a first fuel into the turbulent melting zone under a level of the molten material in the zone, one or more of the burners configured to impart heat and turbulence to at least some of the molten material in the turbulent melting zone, producing a turbulent molten material comprising a plurality of bubbles suspended in the molten material, the bubbles comprising at least some of the combustion products (box 904). The process further comprises discharging the molten material comprising bubbles from the melter vessel through the melter exit structure into a forehearth (box 906), and drawing the molten material comprising bubbles through a bushing fluidly connected to the forehearth to produce a glass fiber comprising a plurality of interior regions substantially devoid of glass (box 908).

Process embodiment 1000 of FIG. 10 includes the steps of feeding at least one partially or wholly vitrifiable material into a feed inlet of a turbulent melting zone of a melter vessel comprising a floor, a ceiling, and a wall connecting the floor and ceiling at a perimeter of the floor and ceiling, the melter vessel comprising a feed opening in the wall or ceiling and an exit end comprising a melter exit structure for discharging molten material formed in the melting zone (box 1002). The process further includes heating the at least one partially or wholly vitrifiable material with at least one burner directing combustion products of an oxidant and a first fuel into the turbulent melting zone under a level of the molten material in the zone, one or more of the burners configured to impart heat and turbulence to at least some of the molten material in the turbulent melting zone, producing a turbulent molten material comprising a plurality of bubbles suspended in the molten material, the bubbles comprising at least some of the combustion products (box 1004). Process embodiment 1000 further comprises discharging the molten material comprising bubbles from the melter vessel through the melter exit structure into a forehearth (box 1006), drawing the molten material comprising bubbles through a plurality of bushings producing glass fibers each comprising a plurality of interior regions devoid of glass, the fibers having substantially same outside diameter (box 1008), and controlling flow of the molten material comprising bubbles through the forehearth and bushings so that fibers produced through the bushings are substantially consistent in volume of regions devoid of glass (box 1010).

Process embodiment 1100 of FIG. 11 includes the steps of Feeding at least one partially or wholly vitrifiable material into a feed inlet of a turbulent melting zone of a melter vessel comprising a floor, a ceiling, and a wall connecting the floor and ceiling at a perimeter of the floor and ceiling, the melter vessel comprising a feed opening in the wall or ceiling and an exit end comprising a melter exit structure for discharging molten material formed in the turbulent melting zone (box 1102). Process embodiment 1100 further comprises heating the at least one partially or wholly vitrifiable material with at least one burner directing combustion products of an oxidant and a first fuel into the turbulent melting zone under a level of the molten material in the zone, one or more of the burners configured to impart heat and turbulence to at least some of the molten material in the turbulent melting zone, producing a turbulent molten material comprising a plurality of bubbles suspended in the molten material, the bubbles comprising at least some of the combustion products (box 1104). Embodiment 1100 further comprises discharging the molten material comprising bubbles from the melter vessel through the melter exit structure into a forehearth (box 1106), drawing the molten material comprising bubbles through a plurality of bushings producing glass fibers each comprising a plurality of interior regions devoid of glass, the fibers having substantially same outside diameter (box 1108), controlling flow of the molten material comprising bubbles through the forehearth and bushings so that fibers produced through the bushings are substantially consistent in volume of regions devoid of glass (box 1110), and controlling composition of the molten material by adjusting one or more parameters of one or more of the burners selected from the group consisting of composition of the first fuel, composition of the oxidant, composition of a third fluid injected through at least one of the burners, flow rate of the first fuel, flow rate of the oxidant, and flow rate of the third fluid, wherein the third fluid is selected from the group consisting of a second fuel, a second oxidant, a fluid other than a fuel or an oxidant, and combinations thereof (box 1112).

In operation of systems and processes of this disclosure, feed material, such as E-glass batch (melts at about 1400° C.), insulation glass batch (melts at about 1200° C.), and the like, is optionally processed in a feed processing unit as described, producing densified material, then fed to the melter through a feed chute and melter inlet. Scrap in the form of glass fiber mat and/or insulation having high organic binder content, glass cullet, and the like may be separately fed to the melter. One or more submerged combustion burners are fired to melt the feed materials and to maintain a turbulent molten glass melt. Molten glass moves toward melter exit, and is discharged from the melter directly to a forehearth having one or more bushings, producing the hollow fibers, or fibers having regions devoid of glass. Winders or choppers receive the fibers, making continuous fiber or chopped fiber.

Glass fiber formation, or fiberization, involves a combination of extrusion and attenuation. In extrusion, the molten glass passes out of the forehearth through one or more bushings made of an erosion-resistant platinum/rhodium alloy with very fine orifices, from 200 to as many as 8,000. Bushing plates are heated electronically, and their temperature may be precisely controlled to maintain a constant glass viscosity. Water jets may be used to cool the filaments as they exit the bushing at roughly 1204° C./2200° F. Attenuation is the process of mechanically drawing the extruded streams of molten glass into fibrous elements called filaments, with an outer diameter ranging from about 4 µm to about 40 µm. A high-speed winder catches the molten streams and, because it revolves at a circumferential speed of ~2 miles/~3 km per minute (much faster than the molten glass exits the bushings), tension is applied, drawing them into thin filaments.

Bushing nozzle diameter determines filament diameter, and the nozzle quantity equals the number of ends. A 4,000-nozzle bushing may be used to produce a single roving product or the process can be configured to make four rovings with 1,000 ends each. The bushing also controls the fiber yield or yards of fiber per pound of glass. The processes and systems of the present disclosure allow production of more yards of fiber per pound of glass, due to the existence of the regions devoid of glass. (The metric unit, tex, measures fiber linear density; 1 tex=1 g/km, and yield is the inverse, yd/lb.) A fiber with a yield of 1,800 yd/lb (275 tex) would have a smaller diameter than a 56 yd/lb (8,890 tex) fiber, and an 800-nozzle bushing produces a smaller yield than a 4,000-nozzle bushing. The range of fiber diameter, or micronage, may become more varied as composite reinforcements have become more specialized.

A chemical coating, or size, may be applied to the fibers. Size is typically added at 0.5 to 2.0 percent by weight and may include lubricants, binders and/or coupling agents. Lubricants help to protect the filaments from abrading and breaking as they are collected and wound into forming packages and, later, when they are processed by weavers or other converters into fabrics or other reinforcement forms. Coupling agents may cause the fiber to have an affinity for a particular resin chemistry, improving resin "wetout" and strengthening the adhesive bond at the fiber-matrix interface. Some size chemistries are compatible only with polyester resin and some only with epoxy while others may be used with a variety of resins.

The drawn, sized filaments may be collected together into a bundle, forming a glass strand composed of 51 to 1,624 filaments. The strand is wound onto a drum into a forming package that resembles a spool of thread. The forming packages, still wet from water cooling and sizing, are then dried in an oven, and afterward they are ready to be palletized and shipped or further processed into chopped fiber, roving or yarn. Roving is a collection of strands with little or no twist. An assembled roving, for example, made from 10 to 15 strands wound together into a multi-end roving package, may require additional handling and processing steps. Yarn is made from one or more strands, which may be twisted to protect the integrity of the yarn during subsequent processing operations, such as weaving.

Combustion product gases (flue gases) exit through stack, or may be routed to heat recovery apparatus. If oxy-fuel combustion is employed in some or all burners, the general principle is to operate combustion in the burners in a manner that replaces some of the air with a separate source of oxygen. The overall combustion ratio may not change. Throughput of melter apparatus described in the present disclosure may be 0.5 short ton per day per $ft^2$ of melter footprint (0.5 stpd/$ft^2$) or more, and in some embodiments 2 stpd/$ft^2$ or more. This is at least twice, in certain embodiments ten times the throughput of conventional (non-SC) melter apparatus.

Processes and systems of the present disclosure may be controlled in a number of different manners. In certain embodiments a master controller may be employed, but the processes and systems described herein are not so limited, as any combination of controllers could be used. The controller may be selected from PI controllers, PID controllers (including any known or reasonably foreseeable variations of these), and may compute a residual equal to a difference between a measured value and a set point to produce an output to one or more control elements. The phrase "PID controller" means a controller using proportional, integral, and derivative features. In some cases the derivative mode may not be used or its influence reduced significantly so that the controller may be deemed a PI controller. It will also be recognized by those of skill in the control art that there are existing variations of PI and PID controllers, depending on how the discretization is performed. These known and foreseeable variations of PI, PID and other controllers are considered within the disclosure.

The controller may compute the residual continuously or non-continuously. Other possible implementations of the processes and systems of the present disclosure are those wherein the controller may comprise more specialized control strategies, such as strategies selected from feed forward, cascade control, internal feedback loops, model predictive control, neural networks, and Kalman filtering techniques. The controller may receive input signals from, and provide output signals for, for example, but not limited to, the following parameters: velocity of fuel entering a burner; velocity of primary oxidant entering a burner; velocity of secondary oxidant entering a burner; mass flow rate of primary and/or secondary or tertiary fuel entering a burner; mass flow rate of primary oxidant entering a burner; temperature of a fuel entering a burner; temperature of primary oxidant entering a burner; mass flow rate of alternate gaseous species; pressure of primary oxidant entering a burner;

humidity of primary oxidant; feed rate of material into the melter, flow rate of molten material out of the melter, mass flow rate of hot effluent exhaust, mass flow rates of input and output heat transfer fluids for fluid-cooled panels, and the like. Burner geometry and combustion ratio are other examples of input signals.

Submerged combustion burner combustion (flame) temperature may be controlled by monitoring one or more parameters selected from velocity of the fuel, velocity of the primary oxidant, mass and/or volume flow rate of the fuel, mass and/or volume flow rate of the primary oxidant, energy content of the fuel, temperature of the fuel as it enters the burner, temperature of the primary oxidant as it enters the burner, temperature of the effluent, pressure of the primary oxidant entering the burner, humidity of the oxidant, burner geometry, combustion ratio, and combinations thereof. Exemplary processes and systems of the disclosure comprise a combustion controller which receives one or more input parameters selected from velocity of the fuel, velocity of the primary oxidant, mass and/or volume flow rate of the fuel, mass and/or volume flow rate of the primary oxidant, energy content of the fuel, temperature of the fuel as it enters the burner, temperature of the primary oxidant as it enters the burner, pressure of the oxidant entering the burner, humidity of the oxidant, burner geometry, oxidation ratio, temperature of the effluent and combinations thereof, and employs a control algorithm to control combustion temperature based on one or more of these input parameters.

The term "control", used as a transitive verb, means to verify or regulate by comparing with a standard or desired value. Control may be closed loop, feedback, feed-forward, cascade, model predictive, adaptive, heuristic and combinations thereof. The term "controller" means a device at least capable of accepting input from sensors and meters in real time or near-real time, and sending commands directly to control elements, and/or to local devices associated with control elements able to accept commands. A controller may also be capable of accepting input from human operators; accessing databases, such as relational databases; sending data to and accessing data in databases, data warehouses or data marts; and sending information to and accepting input from a display device readable by a human. A controller may also interface with or have integrated therewith one or more software application modules, and may supervise interaction between databases and one or more software application modules.

The apparatus (sometimes referred to herein as burners) used for submerged combustion may provide an amount of heat which is effective to melt the initial raw material to form the molten material, and to maintain the molten material in its molten state. The optimal temperature for melting the initial raw material and maintaining the molten material in its molten state can depend on, for example, the composition of the initial raw material and the rate at which the molten material is removed from the melter apparatus, and the composition of fuels, oxidants, and alternative gas species. For example, the maximum temperature in the melter apparatus can be at least about 1400° C., preferably from about 1400° C. to about 1650° C. The temperature of the molten material can be from about 1050° C. to about 1450° C.; however, systems and processes of the present disclosure are not limited to operation within the above temperature ranges. The molten material removed from the melter apparatus is typically a substantially homogeneous composition, but is not limited thereto.

Submerged combustion burners useful in the systems and processes described herein (and that are not modified as described herein for introduction of alternative fuels and/or gaseous species) include those described in U.S. Pat. Nos. 4,539,034; 3,170,781; 3,237,929; 3,260,587; 3,606,825; 3,627,504; 3,738,792; 3,764,287; 7,273,583, and Applicant's U.S. Pat. No. 8,875,544, all of which are incorporated herein by reference in their entirety. Regardless of the burner type selected, the general idea is for the burners to provide heat energy to a bath of molten material and simultaneously create a well-mixed, turbulent molten material. The burners function by firing a burning gaseous or liquid fuel-oxidant mixture into a volume of molten material. The burners described in the '583 patent provide a stable flame at the point of injection of the fuel-oxidant mixture into the melt to prevent the formation of frozen melt downstream as well as to prevent any resultant explosive combustion, and constant, reliable, and rapid ignition of the fuel-oxidant mixture such that the mixture burns quickly inside the molten material and releases the heat of combustion into the melt. Completion of the combustion process results in bubbles rising to the surface of the turbulent melt. The location of the injection point for the fuel-oxidant mixture below the surface of the melting material enhances mixing of the components being melted and increases homogeneity of the melt. Thermal $NO_x$ emissions are greatly reduced due to the lower flame temperatures resulting from the melt-quenched flame and further due to insulation of the high temperature flame from the atmosphere.

Melter apparatus useful in processes and systems in accordance with the present disclosure may also comprise one or more wall-mounted submerged combustion burners, and/or one or more roof-mounted burners. Roof-mounted burners may be useful to pre-heat the melter apparatus melting zone and may serve as ignition sources for one or more submerged combustion burners. Melter apparatus having only wall-mounted, submerged-combustion burners are also considered within the present disclosure. Roof-mounted burners may be oxy-fuel burners, but as they are only used in certain situations, are more likely to be air/fuel burners. Most often they would be shut-off after pre-heating the melter and/or after starting one or more submerged combustion burners. In certain embodiments, all submerged combustion burners are oxy-fuel burners (where "oxy" means oxygen, or oxygen-enriched air, as described earlier), but this is not necessarily so in all embodiments; some or all of the submerged combustion burners may be air-fuel burners. Furthermore, heating may be supplemented by electrical heating in certain embodiments, in certain melter and forehearth zones.

The total quantities of fuel and oxidant used by the combustion system are such that the flow of oxygen may range from about 0.9 to about 1.2 of the theoretical stoichiometric flow of oxygen necessary to obtain the complete combustion of the fuel flow. Another expression of this statement is that the combustion ratio may range from about 0.9 to about 1.2, inclusive of the end numbers, and possibly higher or lower in certain embodiments. In certain embodiments, the equivalent fuel content of the feed material must be taken into account. For example, organic binders in glass fiber mat scrap materials will increase the oxidant requirement above that required strictly for fuel being combusted. In consideration of these embodiments, the combustion ratio may be increased above 1.2, for example to 1.5, or to 2, or 2.5, or even higher, depending on the organic content of the feed materials.

The velocity of the fuel in the various submerged combustion burners depends on the burner geometry used, but generally is at least about 15 m/s. The upper limit of fuel velocity depends primarily on the desired mixing of the melt in the melter apparatus, melter geometry, and the geometry of the burner; if the fuel velocity is too low, the flame temperature may be too low, providing inadequate melting, which is not desired, and if the fuel flow is too high, flame might impinge on the melter floor, roof or wall, and/or heat will be wasted, and/or batch fines may short-circuit the melter and escape through the stack (despite the feed densification discussed herein) which is also not desired, and/or the degree of turbulence may so great as to be detrimental to refractory, or other materials of construction. High turbulence may also produce an undesirably high amount of foam or bubbles in the melt that cannot produce hollow fibers, or fibers having regions devoid of glass.

Those of skill in this art will readily understand the need for, and be able to construct suitable fuel supply conduits and oxidant supply conduits, as well as respective flow control valves, threaded fittings, quick connect/disconnect fittings, hose fittings, and the like.

Melter apparatus useful in the various embodiments described in accordance with the present disclosure may be constructed using only fluid-cooled refractory panels, with or without a thin refractory "glass-contact" liner. The thin refractory liner may be 1 centimeter, 2 centimeters, 3 centimeters or more in thickness, however, greater thickness may entail more expense without resultant greater benefit. The refractory liner may be one or multiple layers. Alternatively, melters described herein may be constructed using cast concretes such as disclosed in U.S. Pat. No. 4,323,718. The thin refractory linings discussed herein may comprise materials described in the '718 patent, which is incorporated herein by reference. Two cast concrete layers are described in the '718 patent, the first being a hydraulically setting insulating composition (for example, that known under the trade designation CASTABLE BLOC-MIX-G, a product of Fleischmann Company, Frankfurt/Main, Federal Republic of Germany). This composition may be poured in a form of a wall section of desired thickness, for example a layer 5 cm thick, or 10 cm, or greater. This material is allowed to set, followed by a second layer of a hydraulically setting refractory casting composition (such as that known under the trade designation RAPID BLOCK RG 158, a product of Fleischmann company, Frankfurt am Main, Federal Republic of Germany) may be applied thereonto. Other suitable materials for the refractory cooled panels, melter refractory liners, and refractory block burners (if used) are fused zirconia ($ZrO_2$), fused cast AZS (alumina-zirconia-silica), rebonded AZS, or fused cast alumina ($Al_2O_3$). The choice of a particular material is dictated among other parameters by the melter geometry and type of glass to be produced.

Forehearths useful in the various embodiments described in accordance with the present disclosure may be constructed using similar materials as the melters, except that fluid-cooled panels are not typically used (however, their use is not ruled out). Suitable forehearths include those available from Nikolaus Sorg Gmbh & Co. KG, Lohr am Main, Germany.

Although only a few exemplary embodiments of this disclosure have been described in detail above, those skilled in the art will readily appreciate that many modifications are possible in the exemplary embodiments without materially departing from the novel apparatus and processes described herein. Accordingly, all such modifications are intended to be included within the scope of this disclosure as defined in the following claims. In the claims, no clauses are intended to be in the means-plus-function format allowed by 35 U.S.C. § 112, paragraph 6 unless "means for" is explicitly recited together with an associated function. "Means for" clauses are intended to cover the structures described herein as performing the recited function and not only structural equivalents, but also equivalent structures.

What is claimed is:

1. A method of operating a submerged combustion melter for melting a glass-forming material, the method comprising:
   providing the submerged combustion melter comprising a melt chamber having an interior at least partially defined by a melt chamber floor, at least one melt chamber sidewall, and a melt chamber roof;
   disposing, in the interior of the melt chamber, the glass-forming material;
   disposing, in the melt chamber floor, a submerged combustion burner;
   introducing, to the submerged combustion burner, a first fluid via a first conduit disposed in the submerged combustion burner wherein the first conduit defines a longitudinal axis of the submerged combustion burner, and wherein the first conduit terminates at a body of the submerged combustion burner that defines a connector section and an angled section, wherein the connector section is aligned with the longitudinal axis and couples the first conduit to the angled section, wherein the angled section is disposed at a first angle to the longitudinal axis;
   introducing, to the submerged combustion burner, a second fluid via a second conduit disposed in the submerged combustion burner, wherein the second conduit is parallel to the longitudinal axis and terminates at and is fluidically coupled to one of a plurality of non-central passages defined by the body, wherein the plurality of non-central passages are disposed at a second angle to the longitudinal axis;
   introducing, to the submerged combustion burner, a third fluid via a plurality of third conduits disposed in the submerged combustion burner, wherein the plurality of third conduits are discrete from and surround the second conduit and comprise a first portion parallel to the longitudinal axis and a second portion disposed at a third angle to the longitudinal axis;
   mixing the first fluid with the second fluid and the third fluid in a mixing region to form a mixture of the first fluid and the second fluid and the third fluid, wherein the mixing region is at least partially defined by an outermost surface of the burner, wherein a discharge opening of one of the plurality of third conduits into the mixing region is disposed at a first distance from the longitudinal axis;
   introducing, to a melt region of the submerged combustion melter, a mixture of the first fluid and the second fluid and the third fluid; and
   substantially simultaneously with introducing the mixture of the first fluid and the second fluid and the third fluid, circulating concentrically around the first conduit, the second conduit, and the third conduit, a cooling fluid, wherein the cooling fluid is circulated in a cooling volume having an innermost distance from the longitudinal axis less than the first distance, and wherein the cooling volume separates adjacent third conduits of the plurality of third conduits.

2. The method of claim 1, wherein the first fluid is an oxidant and the second fluid is a fuel gas.

3. The method of claim 1, wherein the first fluid is a fuel gas and the second fluid is an oxidant.

4. The method of claim 3, further comprising introducing, to the submerged combustion burner, a secondary fuel gas via at least one of the third conduits disposed in the submerged combustion burner.

5. The method of claim 4, further comprising mixing in the mixing region, with the fuel gas and the oxidant, the secondary fuel gas.

6. The method of claim 1, wherein the mixing region of the burner is communicatively coupled to the melt region of the interior of the submerged combustion melter.

7. The method of claim 6, wherein the burner comprises a base and wherein the second conduit intersects the body at a first vertical distance from a lowermost point of the base, and wherein the plurality of third conduits intersect the mixing region at a second vertical distance from the lowermost point of the base, wherein the first vertical distance is different than the second vertical distance.

8. The method of claim 7, wherein circulating the cooling fluid comprises circulating the cooling fluid to a third vertical distance from the lowermost point of the base, wherein the third vertical distance is greater than each of the first vertical distance and the second vertical distance.

9. The method of claim 6, wherein at least two of the plurality of third conduits converges towards the longitudinal axis.

10. The method of claim 1, wherein at least a portion of the cooling volume is disposed above the body that defines the connector section, the angled section, and the plurality of non-central passages.

11. The method of claim 10, wherein the cooling volume is defined by an end cap.

12. The method of claim 1, wherein each of the first fluid, the second fluid, and the third fluid are different fluids.

13. The method of claim 1, wherein the outermost surface of the burner comprises an uppermost surface of the burner.

14. The method of claim 1, wherein the first angle is different than the second angle.

* * * * *